(12) United States Patent
Masuda et al.

(10) Patent No.: US 10,326,920 B2
(45) Date of Patent: *Jun. 18, 2019

(54) SOLID-STATE IMAGING DEVICE AND METHOD FOR MANUFACTURING THE SAME, AND ELECTRONIC APPARATUS

(71) Applicant: SONY CORPORATION, Tokyo (JP)

(72) Inventors: Yoshiaki Masuda, Kumamoto (JP);
Yuki Miyanami, Kanagawa (JP);
Hideshi Abe, Kanagawa (JP);
Tomoyuki Hirano, Kanagawa (JP);
Masanari Yamaguchi, Tokyo (JP);
Yoshiki Ebiko, Kanagawa (JP);
Kazufumi Watanabe, Kumamoto (JP);
Tomoharu Ogita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/040,145

(22) Filed: Jul. 19, 2018

(65) Prior Publication Data

US 2018/0324339 A1    Nov. 8, 2018

Related U.S. Application Data

(63) Continuation of application No. 15/720,993, filed on Sep. 29, 2017, now Pat. No. 10,044,918, which is a
(Continued)

(30) Foreign Application Priority Data

Jul. 3, 2013   (JP) .................................. 2013-139830
May 20, 2014   (JP) .................................. 2014-104167

(51) Int. Cl.
*H04N 5/225*   (2006.01)
*G02B 1/118*   (2015.01)
(Continued)

(52) U.S. Cl.
CPC .......... *H04N 5/2254* (2013.01); *G02B 1/118* (2013.01); *H01L 27/1463* (2013.01);
(Continued)

(58) Field of Classification Search
None
See application file for complete search history.

(56) References Cited

U.S. PATENT DOCUMENTS 9,461,197 B2 * 10/2016 Saito ..................... H01L 33/005
10,044,918 B2 * 8/2018 Masuda ............ H01L 27/14621
(Continued)

FOREIGN PATENT DOCUMENTS

JP    2003-249639    9/2003
JP    2006-147991    6/2006
(Continued)

OTHER PUBLICATIONS

Official Action (no English translation available) for Japanese Patent Application No. 2018039801, dated Jan. 29, 2019, 5 pages.

*Primary Examiner* — Cynthia Segura
(74) *Attorney, Agent, or Firm* — Sheridan Ross P.C.

(57) ABSTRACT

The present disclosure relates to a solid-state imaging device, a method for manufacturing the same, and an electronic apparatus capable of improving sensitivity while suppressing degradation of color mixture. The solid-state imaging device includes an anti-reflection portion having a moth-eye structure provided on a boundary surface on a light-receiving surface side of a photoelectric conversion region of each pixel arranged two-dimensionally, and an inter-pixel light-blocking portion provided below the boundary surface of the anti-reflection portion to block incident light. In addition, the photoelectric conversion region is a semiconductor region, and the inter-pixel light-blocking portion has a trench structure obtained by digging the
(Continued)

semiconductor region in a depth direction at a pixel boundary. The techniques according to the present disclosure can be applied to, for example, a solid-state imaging device of a rear surface irradiation type.

41 Claims, 27 Drawing Sheets

Related U.S. Application Data continuation of application No. 14/891,947, filed as application No. PCT/JP2014/066400 on Jun. 20, 2014, now Pat. No. 9,819,846.

(51) Int. Cl.
| | |
|---|---|
| H01L 27/146 | (2006.01) |
| H01L 31/0232 | (2014.01) |
| H04N 5/369 | (2011.01) |
| H01L 31/10 | (2006.01) |
| H04N 5/359 | (2011.01) |
| H04N 5/374 | (2011.01) |
| H04N 9/04 | (2006.01) |

(52) U.S. Cl.
CPC .... *H01L 27/1464* (2013.01); *H01L 27/14621* (2013.01); *H01L 27/14623* (2013.01); *H01L 27/14627* (2013.01); *H01L 27/14629* (2013.01); *H01L 31/02327* (2013.01); *H01L 31/10* (2013.01); *H04N 5/359* (2013.01); *H04N 5/369* (2013.01); *H04N 5/3696* (2013.01); *H04N 5/374* (2013.01); *H04N 9/04* (2013.01)

(56) References Cited

U.S. PATENT DOCUMENTS

| | | | | |
|---|---|---|---|---|
| 2005/0040440 A1* | 2/2005 | Murakami | .......... | H01L 27/1462 257/225 |
| 2008/0291303 A1* | 11/2008 | Onozawa | ............. | G02B 5/1885 348/294 |
| 2010/0244169 A1* | 9/2010 | Maeda | ................... | G02B 1/118 257/432 |
| 2010/0259668 A1* | 10/2010 | Yamada | ............... | H04N 5/2254 348/340 |
| 2011/0018080 A1* | 1/2011 | Ootake | ............. | H01L 27/14621 257/432 |
| 2011/0074283 A1* | 3/2011 | An | ......... | H01L 31/107 313/533 |
| 2011/0084350 A1* | 4/2011 | Murakoshi | .............. | H01L 24/05 257/432 |
| 2011/0204467 A1* | 8/2011 | Ohchi | ................. | H01L 27/1463 257/443 |
| 2011/0220937 A1* | 9/2011 | Jeong | ..................... | H01L 33/22 257/98 |
| 2011/0254440 A1* | 10/2011 | Minoura | ............ | H01L 51/003 315/32 |
| 2012/0235266 A1* | 9/2012 | Ootsuka | ........... | H01L 27/14623 257/432 |
| 2013/0234276 A1* | 9/2013 | Hiyama | ............ | H01L 27/14623 257/435 |
| 2013/0264467 A1* | 10/2013 | Hong | ................ | H01L 27/14609 250/208.1 |
| 2014/0016012 A1* | 1/2014 | Oishi | ..................... | H04N 5/372 348/311 |
| 2014/0110809 A1* | 4/2014 | Kitamura | .......... | H01L 27/14623 257/435 |
| 2014/0217457 A1* | 8/2014 | Cho | ........................ | H01L 33/20 257/99 |
| 2014/0361321 A1* | 12/2014 | Saito | ..................... | H01L 33/005 257/89 |
| 2015/0129915 A1* | 5/2015 | Lee | ......................... | H01L 33/20 257/98 |
| 2015/0255498 A1* | 9/2015 | Sugiura | ............. | H01L 27/14621 257/432 |
| 2015/0362707 A1* | 12/2015 | Sanghera | ............... | G02B 1/118 359/356 |
| 2016/0035770 A1* | 2/2016 | Ahn | ..................... | H01L 27/1463 257/432 |
| 2017/0141151 A1* | 5/2017 | Sato | ................. | H01L 27/14632 |

FOREIGN PATENT DOCUMENTS

| | | |
|---|---|---|
| JP | 2009-218357 | 9/2009 |
| JP | 2011-216623 | 10/2011 |
| JP | 2012-169530 | 9/2012 |
| JP | 2013-033864 | 2/2013 |

* cited by examiner

SOLID-STATE IMAGING DEVICE AND METHOD FOR MANUFACTURING THE SAME, AND ELECTRONIC APPARATUS

CROSS REFERENCE TO RELATED APPLICATIONS

This application is a continuation of U.S. patent application Ser. No. 15/720,993, filed Sep. 29, 2017, which is continuation of U.S. patent application Ser. No. 14/891,947, filed Nov. 17, 2015, which is a national stage application under 35 U.S.C. 371 and claims the benefit of PCT Application No. PCT/JP2014/066400 having an international filing date of Jun. 20, 2014, which designated the United States, which PCT application claimed the benefit of Japanese Patent Application No. 2013-139830 filed Jul. 3, 2013, and Japanese Patent Application No. 2014-104167 filed May 20, 2014, the disclosures of which are incorporated herein by reference in their entirety.

TECHNICAL FIELD

The present disclosure relates to a solid-state imaging device, a method for manufacturing the same, and an electronic apparatus, and in particular, to a solid-state imaging device, a method for manufacturing the same, and an electronic apparatus capable of improving sensitivity while suppressing degradation of color mixture.

BACKGROUND ART

In a solid-state imaging device, a so-called moth-eye structure, in which a fine uneven structure is provided on a boundary surface on a light-receiving surface side of a silicon layer in which a photodiode is formed, has been proposed as a structure for preventing reflection of incident light (for example, see Patent Documents 1 and 2).

CITATION LIST

Patent Document

Patent Document 1: Japanese Patent Application Laid-Open No. 2010-272612
Patent Document 2: Japanese Patent Application Laid-Open No. 2013-33864

SUMMARY OF THE INVENTION

Problems to be Solved by the Invention

However, the moth-eye structure, which can improve sensitivity by preventing reflection of incident light, also causes larger diffusion so that a larger amount of light leaks into an adjacent pixel and thus color mixture is deteriorated.

The present disclosure has been made taking such situation into consideration, and an object thereof is to improve sensitivity while suppressing degradation of color mixture.

Solutions to Problems

A solid-state imaging device according to a first aspect of the present disclosure includes an anti-reflection portion having a moth-eye structure provided on a boundary surface on a light-receiving surface side of a photoelectric conversion region of each pixel arranged two-dimensionally, and an inter-pixel light-blocking portion provided below the boundary surface of the anti-reflection portion to block incident light.

A method for manufacturing a solid-state imaging device according to a second aspect of the present disclosure includes forming an anti-reflection portion having a moth-eye structure on a boundary surface on a light-receiving surface side of a photoelectric conversion region of each pixel arranged two-dimensionally, and forming an inter-pixel light-blocking portion below the boundary surface of the anti-reflection portion to block incident light.

In the second aspect of the present disclosure, the anti-reflection portion having the moth-eye structure is formed on the boundary surface on the light-receiving surface side of the photoelectric conversion region of each pixel arranged two-dimensionally, while the inter-pixel light-blocking portion is formed below the boundary surface of the anti-reflection portion to block incident light.

An electronic apparatus according to a third aspect of the present disclosure includes a solid-state imaging device including an anti-reflection portion having a moth-eye structure provided on a boundary surface on a light-receiving surface side of a photoelectric conversion region of each pixel arranged two-dimensionally, and an inter-pixel light-blocking portion provided below the boundary surface of the anti-reflection portion to block incident light.

In the first and third aspects of the present disclosure, the anti-reflection portion having the moth-eye structure is provided on the boundary surface on the light-receiving surface side of the photoelectric conversion region of each pixel arranged two-dimensionally, while the inter-pixel light-blocking portion is provided below the boundary surface of the anti-reflection portion to block incident light.

The solid-state imaging device and the electronic apparatus may be separate devices or modules to be built into another device.

Effects of the Invention

According to the first to third aspects of the present disclosure, sensitivity can be improved while suppressing degradation of color mixture.

MODE FOR CARRYING OUT THE INVENTION

Modes for carrying out the present disclosure (hereinafter, referred to as embodiments) will be described below. The description will be given in the following order.
1. Exemplary Schematic Structure of Solid-State Imaging Device
2. Pixel Structure according to First Embodiment (Pixel Structure including Anti-reflection Portion and Inter-pixel Light-blocking Portion)
3. Pixel Structure according to Second Embodiment (Pixel Structure including Inter-pixel Light-blocking Portion filled with Metal)
4. Variations of Pixel Structure
5. Exemplary Application to Electronic Apparatus
<1. Exemplary Schematic Structure of Solid-State Imaging Device>

Figure 1:
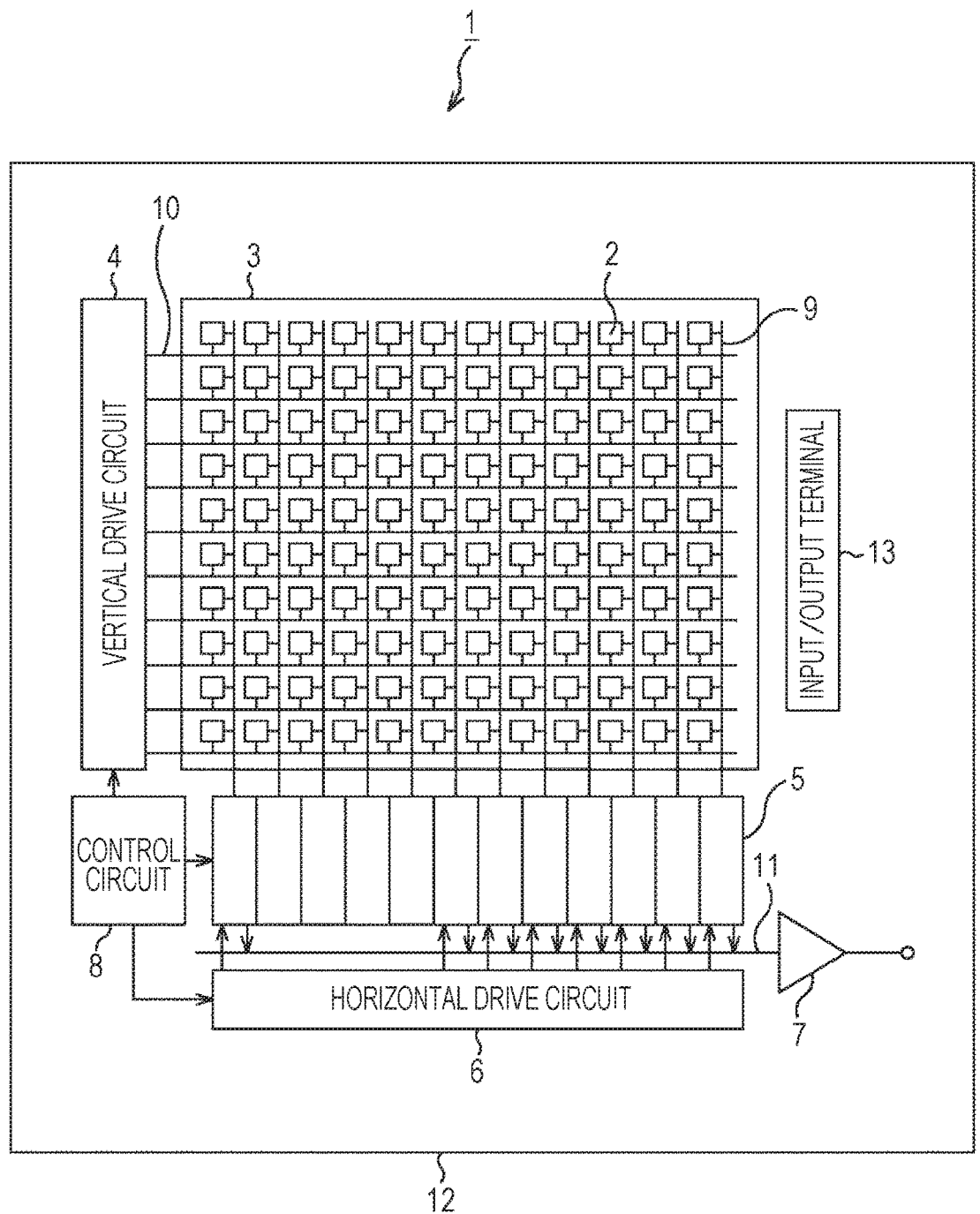
FIG. 1 is a diagram illustrating a schematic structure of a solid-state imaging device according to the present disclosure.

FIG. 1 illustrates a schematic structure of a solid-state imaging device according to the present disclosure.

A solid-state imaging device 1 illustrated in FIG. 1 includes a pixel array section 3 in which pixels 2 are arranged in a two-dimensional array, and a peripheral circuit section disposed in a periphery thereof. The pixel array section 3 and the peripheral circuit section are provided on a semiconductor substrate 12 using, for example, silicon (Si) as a semiconductor. The peripheral circuit section includes a vertical drive circuit 4, a column signal processing circuit 5, a horizontal drive circuit 6, an output circuit 7, a control circuit 8, and the like.

The pixel 2 includes a photodiode as a photoelectric conversion element, and a plurality of pixel transistors. The plurality of pixel transistors is configured by, for example, four MOS transistors, i.e., a transfer transistor, a selection transistor, a reset transistor, and an amplification transistor.

The pixel 2 may have a shared pixel structure. The shared pixel structure includes a plurality of photodiodes, a plurality of transfer transistors, one shared floating diffusion (floating diffusion region), and another shared pixel transistor for each. That is, a shared pixel is configured by the photodiodes and the transfer transistors, constituting a plurality of unit pixels, each group of which shares another pixel transistor.

The control circuit 8 receives an input clock and data for instructing on an operation mode or the like, and outputs data such as internal information of the solid-state imaging device 1. In other words, the control circuit 8, based on a vertical synchronization signal, a horizontal synchronization signal, and a master clock, generates a clock signal or a control signal serving as a reference for operation of the vertical drive circuit 4, the column signal processing circuit 5, the horizontal drive circuit 6, and the like. Additionally, the control circuit 8 outputs the generated clock signal or control signal to the vertical drive circuit 4, the column signal processing circuit 5, the horizontal drive circuit 6, and the like.

The vertical drive circuit 4, which includes, for example, a shift resistor, selects a pixel driving line 10 and supplies a pulse for driving the pixel 2 to the selected pixel driving line 10 to drive the pixels 2 row by row. That is, the vertical drive circuit 4 sequentially selects and scans the pixels 2 in the pixel array section 3 row by row in a vertical direction, and supplies, to the column signal processing circuit 5 through the vertical signal line 9, a pixel signal based on a signal charge generated in accordance with an amount of received light in a photoelectric conversion unit of each pixel 2.

The column signal processing circuit 5 is disposed for each column of the pixels 2 to carry out signal processing, for each pixel column, such as noise elimination on signals output from the pixels 2 included in one row. For example, the column signal processing circuit 5 carries out signal processing such as correlated double sampling (CDS) and AD conversion to eliminate a pixel-specific fixed pattern noise.

The horizontal drive circuit 6, which includes, for example, a shift resistor, sequentially outputs a horizontal scanning pulse to select each of the column signal processing circuits 5 in order and causes each of the column signal processing circuits 5 to output the pixel signal to a horizontal signal line 11.

The output circuit 7 carries out signal processing on a signal sequentially supplied from each of the column signal processing circuits 5 through the horizontal signal line 11 and outputs the processed signal. For example, the output circuit 7 may carry out only buffering or may also carry out black level adjustment, column variation correction, various digital signal processing, and the like. An input/output terminal 13 exchanges signals with the outside.

The solid-state imaging device 1 configured as described above is a CMOS image sensor referred to as a column AD scheme in which the column signal processing circuit 5 is disposed for each pixel column to carry out CDS processing and AD conversion processing.

Furthermore, the solid-state imaging device 1 is a MOS-type solid-state imaging device of a rear surface irradiation type in which light enters from a rear surface side opposite to a front surface side of the semiconductor substrate 12 on which the pixel transistor is formed.

<2. Pixel Structure According to First Embodiment>
<Exemplary Cross-Sectional Structure of Pixel>

Figure 2:
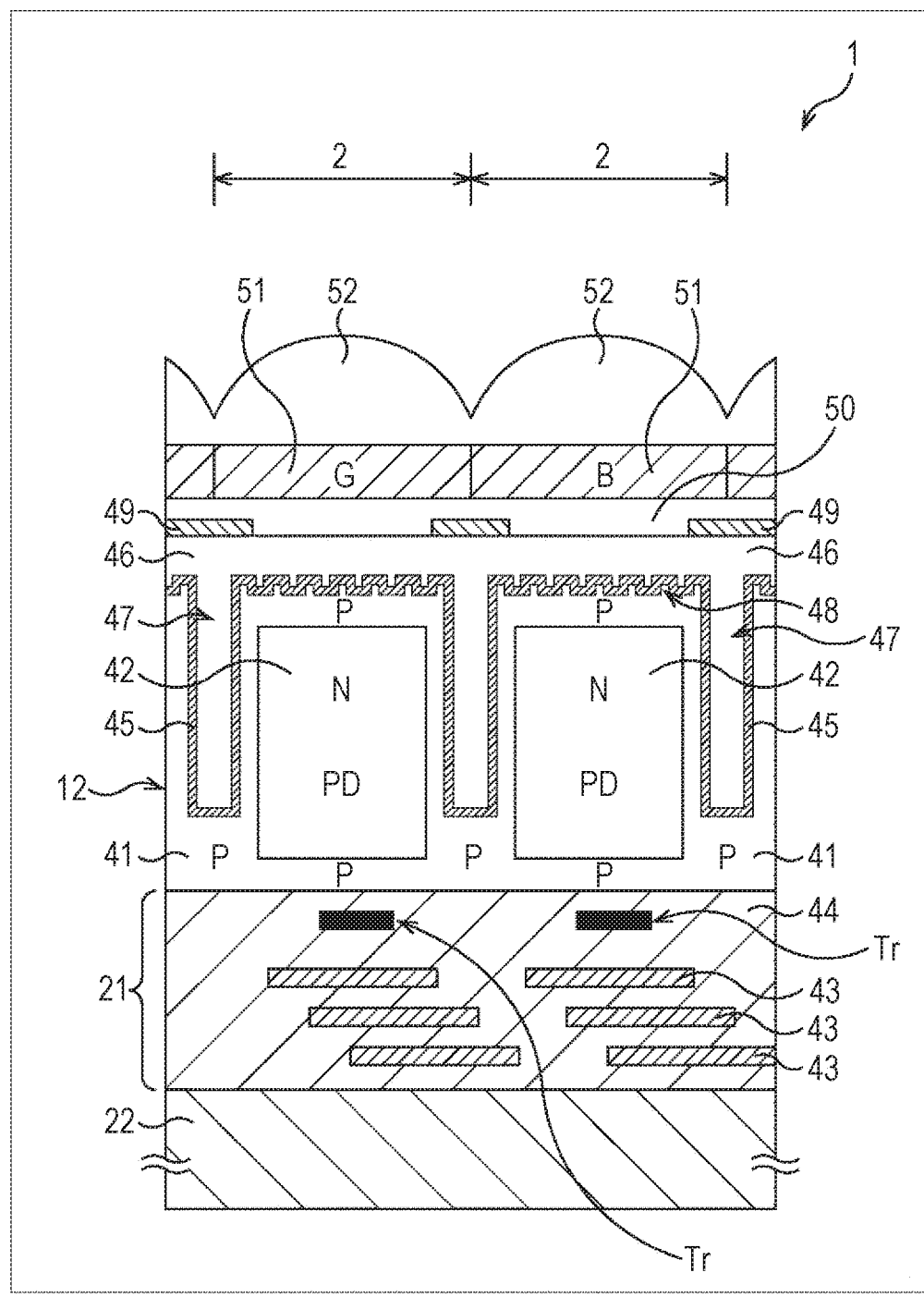
FIG. 2 is a diagram illustrating an exemplary cross-sectional structure of a pixel according to a first embodiment.

FIG. 2 is a diagram illustrating an exemplary cross-sectional structure of a pixel 2 according to a first embodiment.

The solid-state imaging device 1 includes the semiconductor substrate 12, a multi-layer wiring layer 21 formed on the front surface side (lower side in the drawing) of the semiconductor substrate 12, and a supporting substrate 22.

The semiconductor substrate 12 is made of, for example, silicon (Si) and formed to have a thickness of, for example, 1 to 6 μm. In the semiconductor substrate 12, for example, a semiconductor region 42 of an N-type (second conductivity type) is formed for each pixel 2 in a semiconductor region 41 of a P-type (first conductivity type), thereby forming a photodiode PD for each pixel. The P-type semiconductor region 41 extending to both the front surface and the rear surface of the semiconductor substrate 12 also serves as a hole charge accumulation region for suppressing a dark current.

Note that, at a pixel boundary between the pixels 2, which is positioned between the N-type semiconductor regions 42, the P-type semiconductor region 41 is deeply dug as illustrated in FIG. 2 to form an inter-pixel light-blocking portion 47 described later.

A boundary surface (a boundary surface on a light-receiving surface side) of the P-type semiconductor region 41 on an upper side of the N-type semiconductor regions 42 serving as a charge accumulation region, constitutes an anti-reflection portion 48 that prevents reflection of incident light with a so-called moth-eye structure in which a fine uneven structure is formed. In the anti-reflection portion 48, an interval of a spindle-shaped projecting portion, corresponding to a cycle of the unevenness, is set to a range from 40 nm to 200 nm, for example.

The multi-layer wiring layer 21 includes a plurality of wiring layers 43 and an inter-layer insulation film 44. In addition, a plurality of pixel transistors Tr is formed in the multi-layer wiring layer 21, for example, to read charges accumulated in the photodiode PD.

A pinning layer 45 is formed on the rear surface of the semiconductor substrate 12 so as to cover a top surface of the P-type semiconductor region 41. The pinning layer 45 is formed using a high dielectric having a negative fixed charge so that generation of the dark current is suppressed by a positive charge (hole) accumulation region formed around a boundary surface between the pinning layer 45 and the semiconductor substrate 12. When the pinning layer 45 is formed to have a negative fixed charge, the negative fixed charge adds an electric field to the boundary surface between the pinning layer 45 and the semiconductor substrate 12, whereby the positive charge accumulation region is formed.

For example, the pinning layer 45 is formed using hafnium oxide ($HfO_2$). Alternatively, the pinning layer 45 may be formed using zirconium dioxide ($ZrO_2$), tantalum oxide ($Ta_2O_5$), or the like.

A transparent insulation film 46 fills a digging portion in the P-type semiconductor region 41 and is also formed on the entire rear surface of the semiconductor substrate 12 on the top of the pinning layer 45. The digging portion in the P-type semiconductor region 41 filled with the transparent insulation film 46 constitutes the inter-pixel light-blocking portion 47 that prevents incident light from leaking and entering from the adjacent pixel 2.

The transparent insulation film 46 is a material that transmits light, provides insulation properties, and has a refraction index n1 smaller than a refraction index n2 of the semiconductor regions 41 and 42 (n1<n2). For the material of the transparent insulation film 46, silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Im_2O_3$), ytterbium oxide ($Yb_2O_3$), lutetium oxide ($Lu_2O_3$), yttrium oxide ($Y_2O_3$), resin, or the like can be used alone or in combination thereof.

An anti-reflection film may be laminated on an upper side of the pinning layer 45 before the transparent insulation film 46 is formed. For a material of the anti-reflection film, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($HO_2O_3$), thulium oxide ($Tm_2O_3$), ytterbium oxide ($Yb_2O_3$), lutetium oxide ($Lu_2O_3$), yttrium oxide ($Y_2O_3$), or the like can be used.

The anti-reflection film may be formed only on a top surface of the anti-reflection portion 48 having the moth-eye structure, or alternatively, in the same manner as the pinning layer 45, may be formed on both of the top surface of the anti-reflection portion 48 and side surfaces of the inter-pixel light-blocking portion 47.

A light-blocking film 49 is formed in a region of the pixel boundary on the transparent insulation film 46. Any material that blocks light can be used as a material of the light-blocking film 49 and, for example, tungsten (W), aluminum (Al), or copper (Cu) can be used.

A planarization film 50 is formed on an entire surface on an upper side of the transparent insulation film 46, including the light-blocking film 49. For example, an organic material such as resin can be used as a material of the planarization film 50.

A red, green, or blue color filter layer 51 is formed on an upper side of the planarization film 50 for each of the pixels. The color filter layer 51 is formed by, for example, spin-coating using photosensitive resin containing a coloring matter such as pigment or dye. The respective colors of red, green, and blue are arranged by the Bayer array, for example; however, other arrangement method may be employed for arrangement. In an example illustrated in FIG. 2, the blue (B) color filter layer 51 is formed for the pixel 2 on the right and the green (G) color filter layer 51 is formed for the pixel 2 on the left.

An on-chip lens 52 is formed on an upper side of the color filter layer 51 for each of the pixels 2. The on-chip lens 52 is formed of a resin-based material such as styrene-based resin, acrylic-based resin, styrene-acrylic copolymerization-based resin, or siloxane-based resin. Incident light is focused at the on-chip lens 52 and the focused light efficiently enters the photodiode PD through the color filter layer 51.

The respective pixels 2 in the pixel array section 3 of the solid-state imaging device 1 are configured as described above.

<Method for Manufacturing Pixel According to First Embodiment>

Hereinafter, a method for manufacturing the pixel 2 according to the first embodiment will be described with reference to FIGS. 3 to 4.

Figure 3:
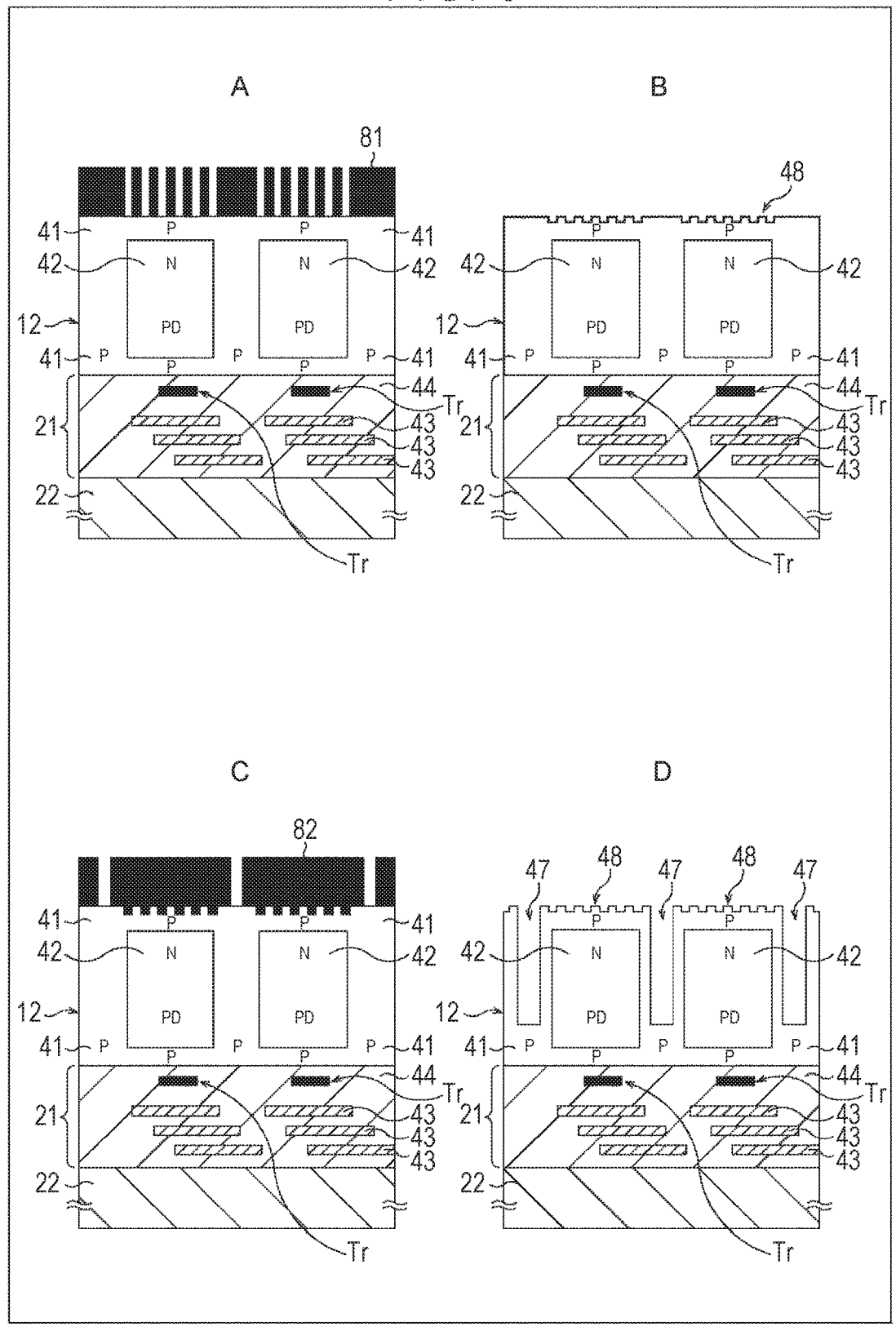
FIG. 3 is a diagram for describing a method for manufacturing a pixel.

Initially, as illustrated in A of FIG. 3, a photoresist 81 is applied on a top surface of the P-type semiconductor region 41 on the rear surface side of the semiconductor substrate 12 and, by a lithography technique, the photoresist 81 is patterned so that an area to be a recessed portion of the moth-eye structure in the anti-reflection portion 48 is opened.

Subsequently, dry etching processing is carried out on the semiconductor substrate 12 based on the patterned photoresist 81. As a result, as illustrated in B of FIG. 3, the recessed portion of the moth-eye structure in the anti-reflection portion 48 is formed; thereafter, the photoresist 81 is removed. The moth-eye structure in the anti-reflection portion 48 may be formed by wet etching processing instead of the dry etching processing.

Next, as illustrated in C of FIG. 3, a photoresist 82 is applied on the top surface of the P-type semiconductor region 41 on the rear surface side of the semiconductor substrate 12 and, by the lithography technique, the photoresist 82 is patterned so that the digging portion of the inter-pixel light-blocking portion 47 is opened.

Subsequently, anisotropic dry etching processing is carried out on the semiconductor substrate 12 based on the patterned photoresist 82. As a result, as illustrated in D of FIG. 3, a trench structure of the inter-pixel light-blocking portion 47 is formed; thereafter, the photoresist 82 is removed. With this, the inter-pixel light-blocking portion 47 having the trench structure is formed.

The inter-pixel light-blocking portion 47 needs to be dug into a deep position of the semiconductor substrate 12, and accordingly, is formed through the anisotropic dry etching processing. As a result, the inter-pixel light-blocking portion 47 can be formed into a digging shape without a taper so that a waveguide function is generated.

Figure 4:
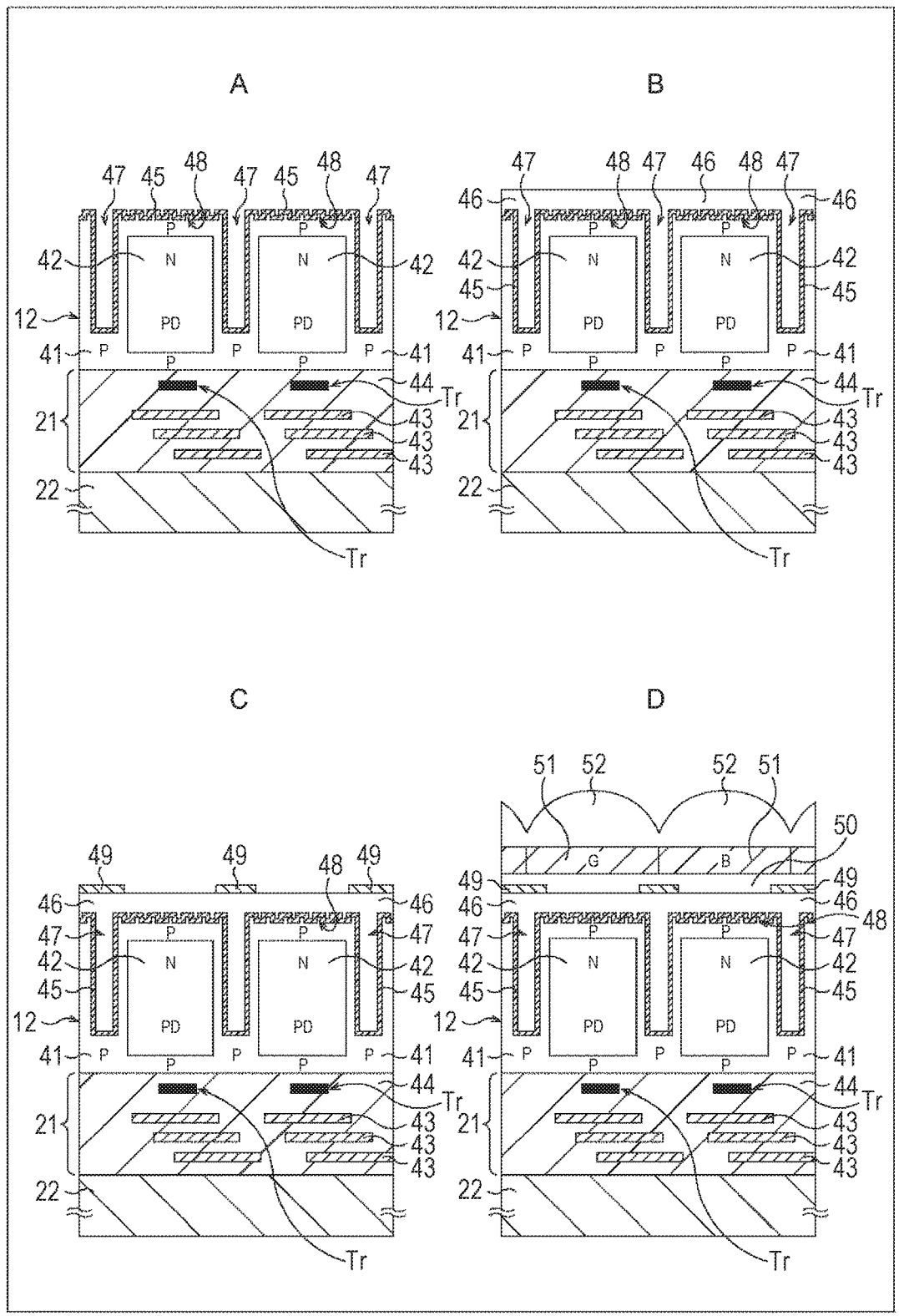
FIG. 4 is a diagram for describing the method for manufacturing a pixel.

As illustrated in A of FIG. 4, the pinning layer 45 is then formed, by a chemical vapor deposition (CVD) method, on an entire surface of the semiconductor substrate 12 in which the anti-reflection portion 48 having the moth-eye structure and the inter-pixel light-blocking portion 47 having the trench structure are formed.

Subsequently, as illustrated in B of FIG. 4, the transparent insulation film 46 is formed on a top surface of the pinning layer 45 by a film formation method with high filling properties such as the CVD method or using a filling material. With this, even the interior of the dug inter-pixel light-blocking portion 47 is filled with the transparent insulation film 46.

Thereafter, as illustrated in C of FIG. 4, the light-blocking film 49 is formed only on a region between the pixels by the lithography technique, and then, as illustrated in D of FIG. 4, the planarization film 50, the color filter layer 51, and the on-chip lens 52 are formed in this order.

The solid-state imaging device 1 having the structure illustrated in FIG. 2 can be manufactured as described above.

<Another Method for Manufacturing Pixel According to First Embodiment>

In the aforementioned manufacturing method, the anti-reflection portion 48 having the moth-eye structure is formed first, and then, the inter-pixel light-blocking portion 47 having the trench structure is formed. However, an order of formation of the anti-reflection portion 48 and the inter-pixel light-blocking portion 47 may be reversed.

Figure 5:
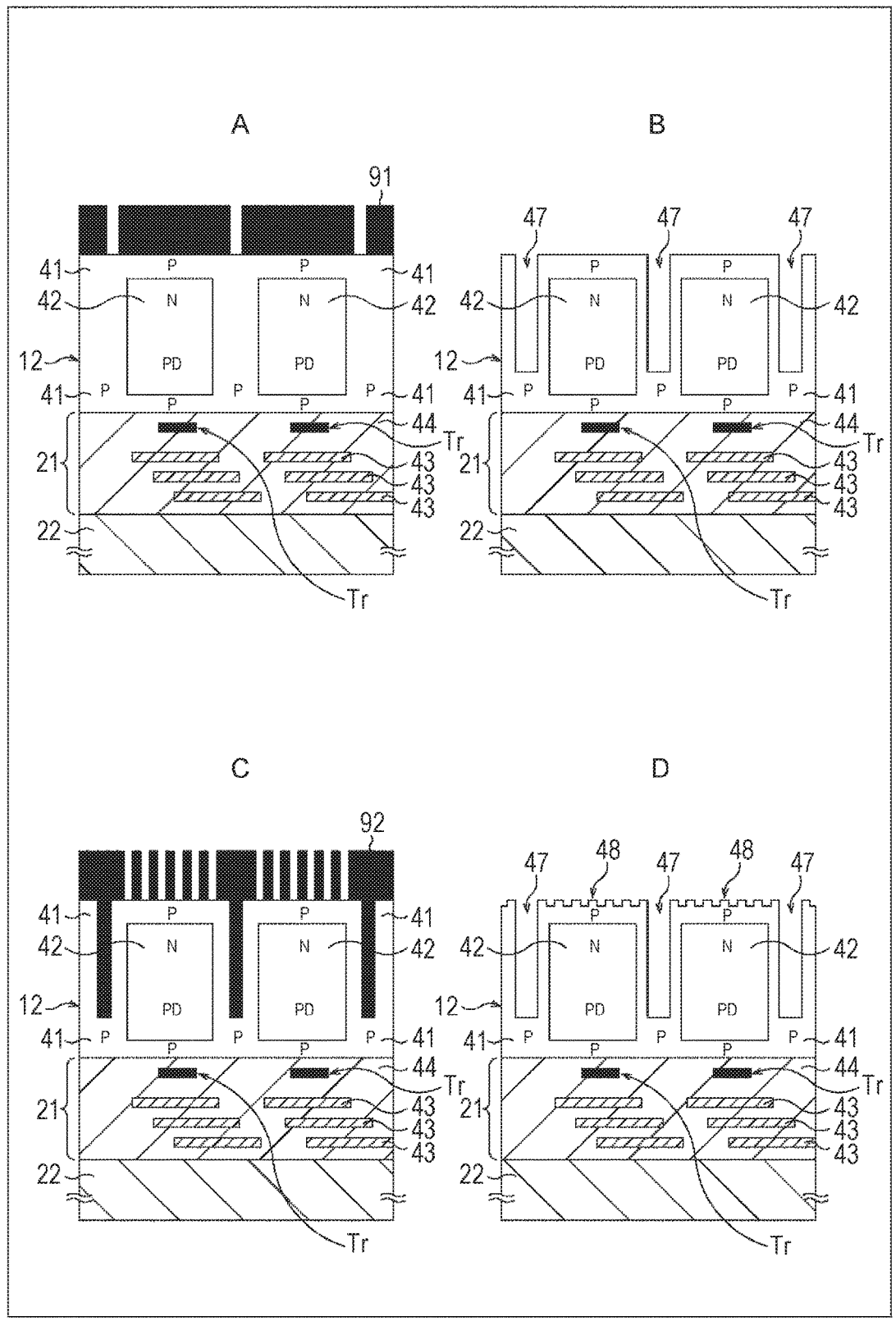
FIG. 5 is a diagram for describing another method for manufacturing a pixel.

Referring to FIG. 5, a manufacturing method for a case where the inter-pixel light-blocking portion 47 having the trench structure is formed first and the anti-reflection portion 48 having the moth-eye structure is then formed will be described.

Initially, as illustrated in A of FIG. 5, a photoresist 91 is applied on a top surface of the P-type semiconductor region 41 on the rear surface side of the semiconductor substrate 12 and, by the lithography technique, the photoresist 91 is patterned so that a trench portion of the inter-pixel light-blocking portion 47 is opened.

Subsequently, the anisotropic dry etching processing is carried out on the semiconductor substrate 12 based on the patterned photoresist 91. As a result, as illustrated in B of FIG. 5, the trench portion of the inter-pixel light-blocking portion 47 is formed; thereafter, the photoresist 91 is removed. With this, the inter-pixel light-blocking portion 47 having the trench structure is formed.

Next, as illustrated in C of FIG. 5, a photoresist 92 is applied on a top surface of the P-type semiconductor region 41 and, by the lithography technique, the photoresist 92 is patterned so that an area to be the recessed portion of the moth-eye structure in the anti-reflection portion 48 is opened.

The dry etching processing is then carried out on the semiconductor substrate 12 based on the patterned photoresist 92. As a result, as illustrated in D of FIG. 5, the recessed portion of the moth-eye structure in the anti-reflection portion 48 is formed; thereafter, the photoresist 92 is removed. With this, the anti-reflection portion 48 having the moth-eye structure is formed. The moth-eye structure in the anti-reflection portion 48 may be formed by the wet etching processing instead of the dry etching processing.

A state illustrated in D of FIG. 5 is the same as that illustrated in D of FIG. 3. Therefore, subsequent methods for manufacturing the transparent insulation film 46, the planarization film 50, and the like are the same as the aforementioned methods illustrated in FIG. 4 and the description thereof will be omitted.

<Effects of Pixel Structure According to First Embodiment>

Figure 6:
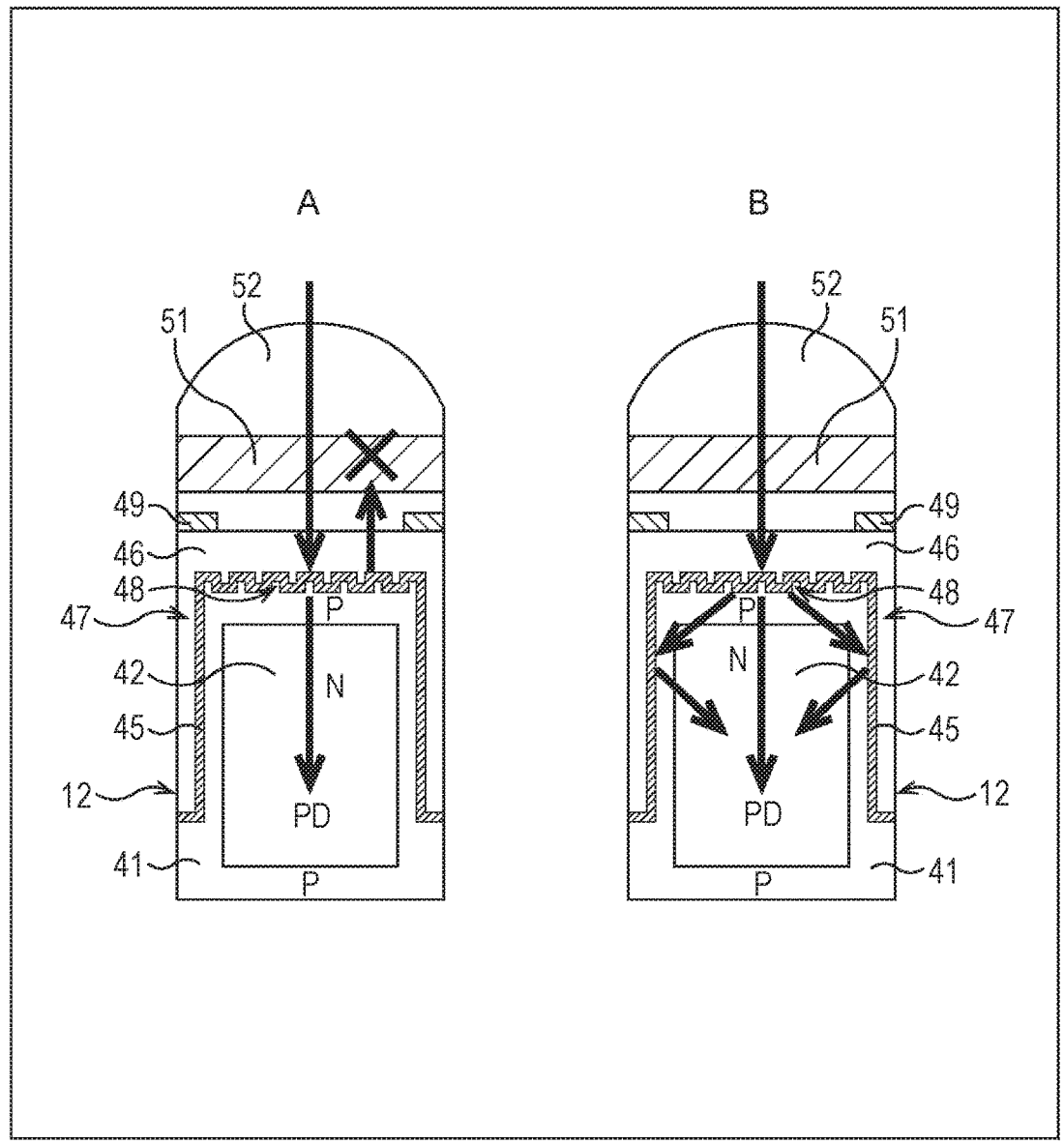
FIG. 6 is a diagram for describing effects of a pixel structure according to the present disclosure.

FIG. 6 is a diagram for describing effects of the pixel structure of the pixel 2 illustrated in FIG. 2.

A of FIG. 6 is a diagram for describing an effect of the anti-reflection portion 48 having the moth-eye structure.

The anti-reflection portion 48 having the moth-eye structure prevents reflection of incident light. With this, sensitivity of the solid-state imaging device 1 can be improved.

B of FIG. 6 is a diagram for describing an effect of the inter-pixel light-blocking portion 47 having the trench structure.

In the past, when the inter-pixel light-blocking portion 47 has not been provided, incident light diffused at the anti-reflection portion 48 has passed through a photoelectric conversion region (semiconductor regions 41 and 42) in some cases. The inter-pixel light-blocking portion 47 has an effect of reflecting incident light diffused at the anti-reflection portion 48 having the moth-eye structure and trapping the incident light within the photoelectric conversion region. With this, an optical distance for silicon absorption is extended, and accordingly, sensitivity can be improved.

Assuming that a refraction index of the inter-pixel light-blocking portion 47 is $n1=1.5$ (corresponding to $SiO_2$) and a refraction index of the semiconductor region 41, in which the photoelectric conversion region is formed, is $n2=4.0$, a waveguide effect (photoelectric conversion region: core, inter-pixel light-blocking portion 47: clad) is generated by a difference in refraction index (n1<n2) so that incident light is trapped within the photoelectric conversion region. The moth-eye structure has a disadvantage of degrading color mixture due to diffusion of light; however, by being combined with the inter-pixel light-blocking portion 47, degradation of color mixture can be canceled, and further, an incident angle at which incident light travels within the photoelectric conversion region is enlarged, thereby generating an advantage of improving efficiency of photoelectric conversion.

Figure 7:
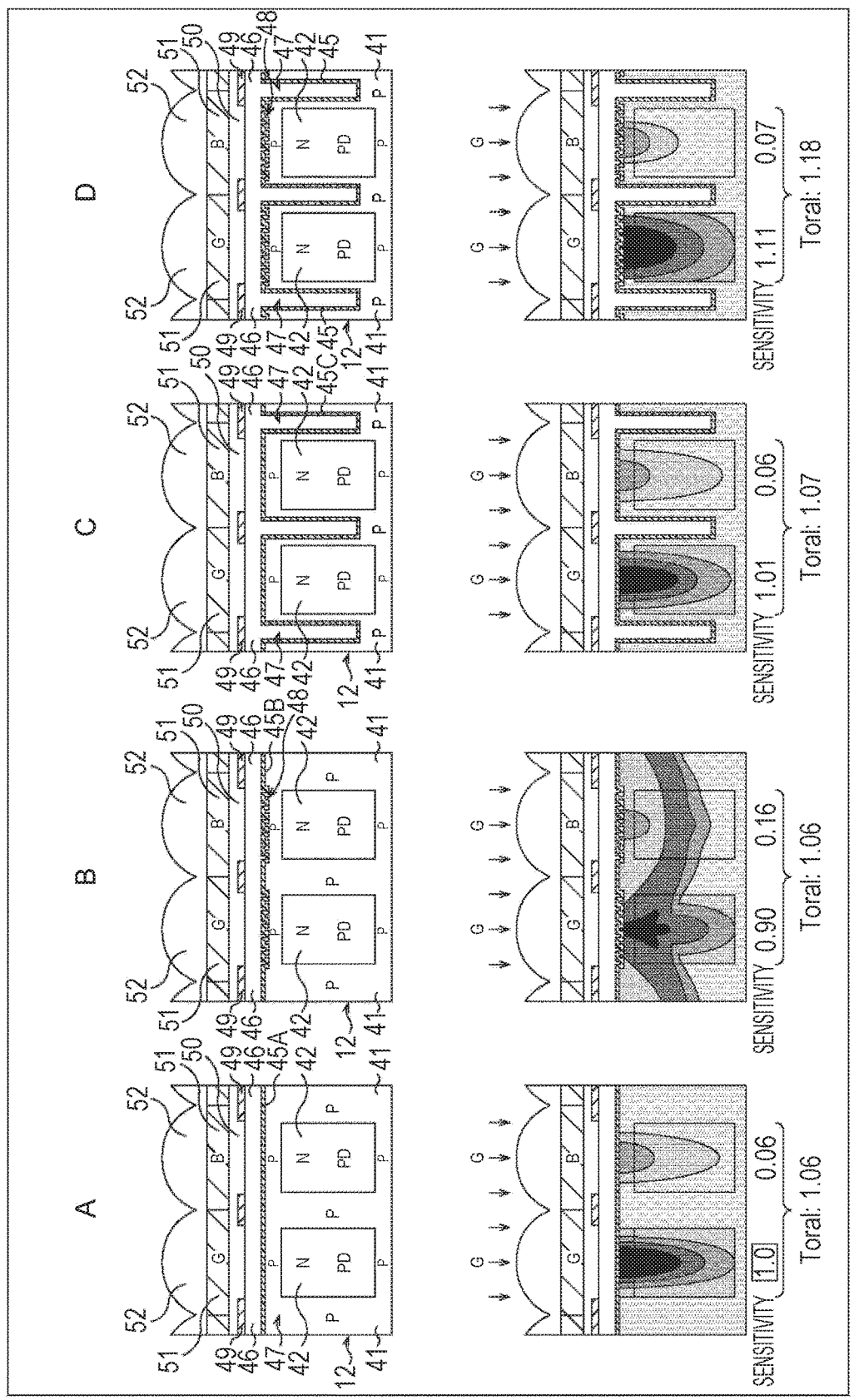
FIG. 7 is a diagram for describing effects of the pixel structure according to the present disclosure.

FIG. 7 is a diagram illustrating effects of the pixel structure of the pixel 2 according to the present disclosure by comparing with another structure.

Each of A to D of FIG. 7 is illustrated as a two-step configuration of an upper and lower diagrams; the upper diagram illustrates a cross-sectional structure diagram of a pixel, whereas the lower diagram is a distribution chart depicting strength of light within the semiconductor substrate 12 in a case where green parallel light enters the pixel having the pixel structure of the upper diagram. Note that, in A to D of FIG. 7, constituent members corresponding to those of the structure of the pixel 2 illustrated in FIG. 2 are denoted with the same reference numerals for easy understanding.

The upper diagram of A of FIG. 7 illustrates a pixel structure of a typical solid-state imaging device, in which the anti-reflection portion 48 having the moth-eye structure and the inter-pixel light-blocking portion 47 having the trench structure are not provided, and a pinning layer 45A is flatly formed on the P-type semiconductor region 41.

In the distribution chart depicting strength of light illustrated in the lower diagram of A of FIG. 7, higher strength of light is expressed in higher density. When light-receiving sensitivity of a green pixel is set as a reference (1.0), because some amount of green light passes through a blue pixel, light-receiving sensitivity of the blue pixel in A of FIG. 7 is 0.06 and total light-receiving sensitivity of the two pixels is 1.06.

The upper diagram of B of FIG. 7 illustrates a pixel structure in which only the anti-reflection portion 48 having the moth-eye structure is formed on the P-type semiconductor region 41.

In the distribution chart illustrated in the lower diagram of B of FIG. 7, incident light diffused at the anti-reflection portion 48 having the moth-eye structure leaks into the adjacent blue pixel. Consequently, light-receiving sensitivity of the green pixel is lowered to 0.90, while light-receiving sensitivity of the adjacent blue pixel is raised to 0.16. Total light-receiving sensitivity of the two pixels is 1.06.

C of FIG. 7 illustrates a pixel structure in which only the inter-pixel light-blocking portion 47 having the trench structure is formed within the P-type semiconductor region 41.

The distribution chart illustrated in the lower diagram of C of FIG. 7 is hardly different from that of the pixel structure in A of FIG. 7; light-receiving sensitivity of the green pixel is 1.01, whereas light-receiving sensitivity of the blue pixel is 0.06, and total light-receiving sensitivity of the two pixels is 1.07.

D of FIG. 7 illustrates the pixel structure according to the present disclosure illustrated in FIG. 2.

In the distribution chart illustrated in the lower diagram of D of FIG. 7, the anti-reflection portion 48 having the moth-eye structure prevents reflection upward, while leakage, into the adjacent blue pixel, of incident light diffused at the anti-reflection portion 48 having the moth-eye structure is prevented by the inter-pixel light-blocking portion 47.

With this, light-receiving sensitivity of the green pixel is raised to 1.11 and light-receiving sensitivity of the blue pixel is 0.07, which is at the same level as the pixel structure in C of FIG. 7. Total light-receiving sensitivity of the two pixels is 1.18.

As described thus far, with the pixel structure according to the present disclosure illustrated in FIG. 2, the anti-reflection portion 48 having the moth-eye structure prevents reflection upward, while leakage, into the adjacent pixel, of incident light diffused at the anti-reflection portion 48 is prevented by the inter-pixel light-blocking portion 47. Accordingly, sensitivity can be improved while degradation of color mixture is suppressed.

<3. Pixel Structure According to Second Embodiment>
<Exemplary Cross-Sectional Structure of Pixel>

Figure 8:
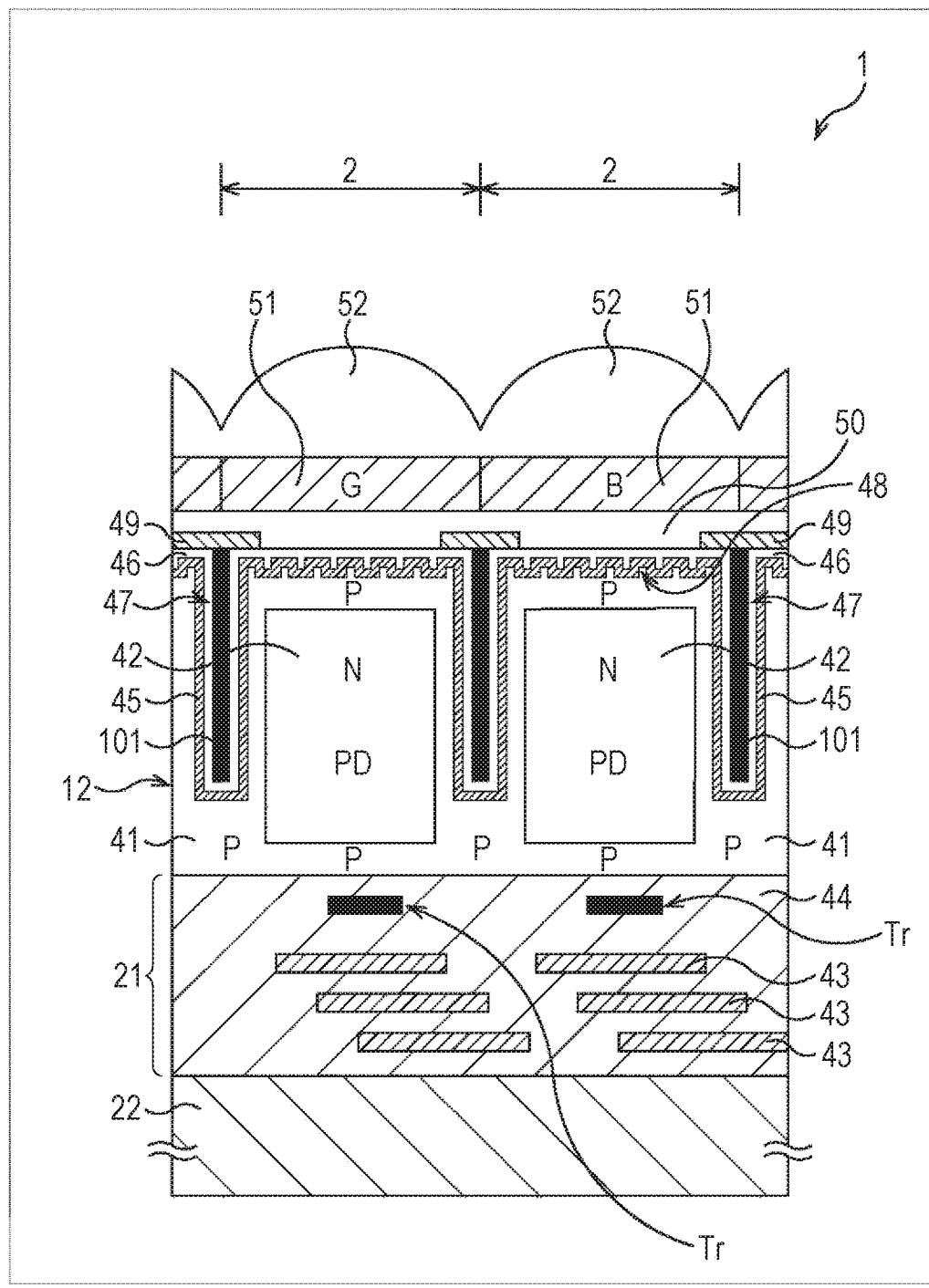
FIG. 8 is a diagram illustrating an exemplary cross-sectional structure of a pixel according to a second embodiment.

FIG. 8 is a diagram illustrating an exemplary cross-sectional structure of a pixel 2 according to a second embodiment.

In FIG. 8, constituent members corresponding to those of the first embodiment illustrated in FIG. 2 are denoted with the same reference numerals and the description thereof will be omitted as appropriate.

The second embodiment illustrated in FIG. 8 is different from the aforementioned first embodiment in that a metal light-blocking portion 101 is newly provided by filling a metal material such as tungsten (W) into a central area of an inter-pixel light-blocking portion 47 having the trench structure, which is disposed between the pixels 2.

Furthermore, in the second embodiment, a transparent insulation film 46 laminated on a surface of a pinning layer 45 is conformally formed using, for example, a sputtering method.

A solid-state imaging device 1 according to the second embodiment is capable of further suppressing color mixture by further providing the metal light-blocking portion 101.

<Method for Manufacturing Pixel According to Second Embodiment>

A method for manufacturing the pixel 2 according to the second embodiment will be described with reference to FIG. 9.

Figure 9:
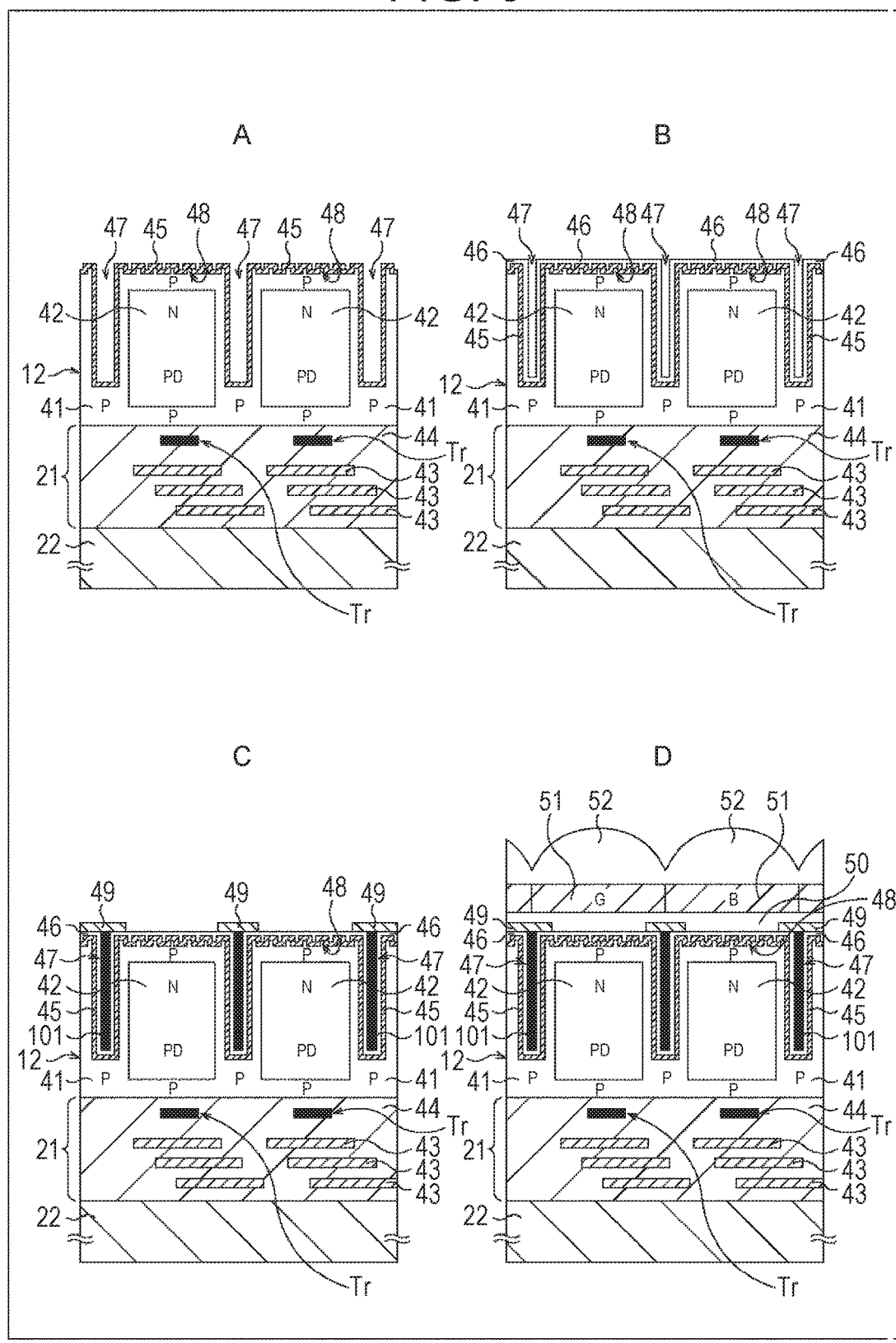
FIG. 9 is a diagram for describing a method for manufacturing a pixel according to the second embodiment.

A state illustrated in A of FIG. 9 is the same as that illustrated in A of FIG. 4 described in the first embodiment for the manufacturing method for the pixel. Accordingly, the manufacturing method up to forming the pinning layer 45 is the same as that of the aforementioned first embodiment.

In addition, as illustrated in B of FIG. 9, the transparent insulation film 46 is conformally formed on the surface of the pinning layer 45 using, for example, the sputtering method.

Subsequently, as illustrated in C of FIG. 9, pattern processing is carried out only for a region between the pixels by the lithography technique using, for example, tungsten (W), whereby the metal light-blocking portion 101 and a light-blocking film 49 are simultaneously formed. The metal light-blocking portion 101 and the light-blocking film 49 may be of course separately formed using different metal materials.

Thereafter, as illustrated in D of FIG. 9, a planarization film 50, a color filter layer 51, and an on-chip lens 52 are formed in this order.

<Exemplary Optimum Conditions for Pixel Structure>

Figure 10:
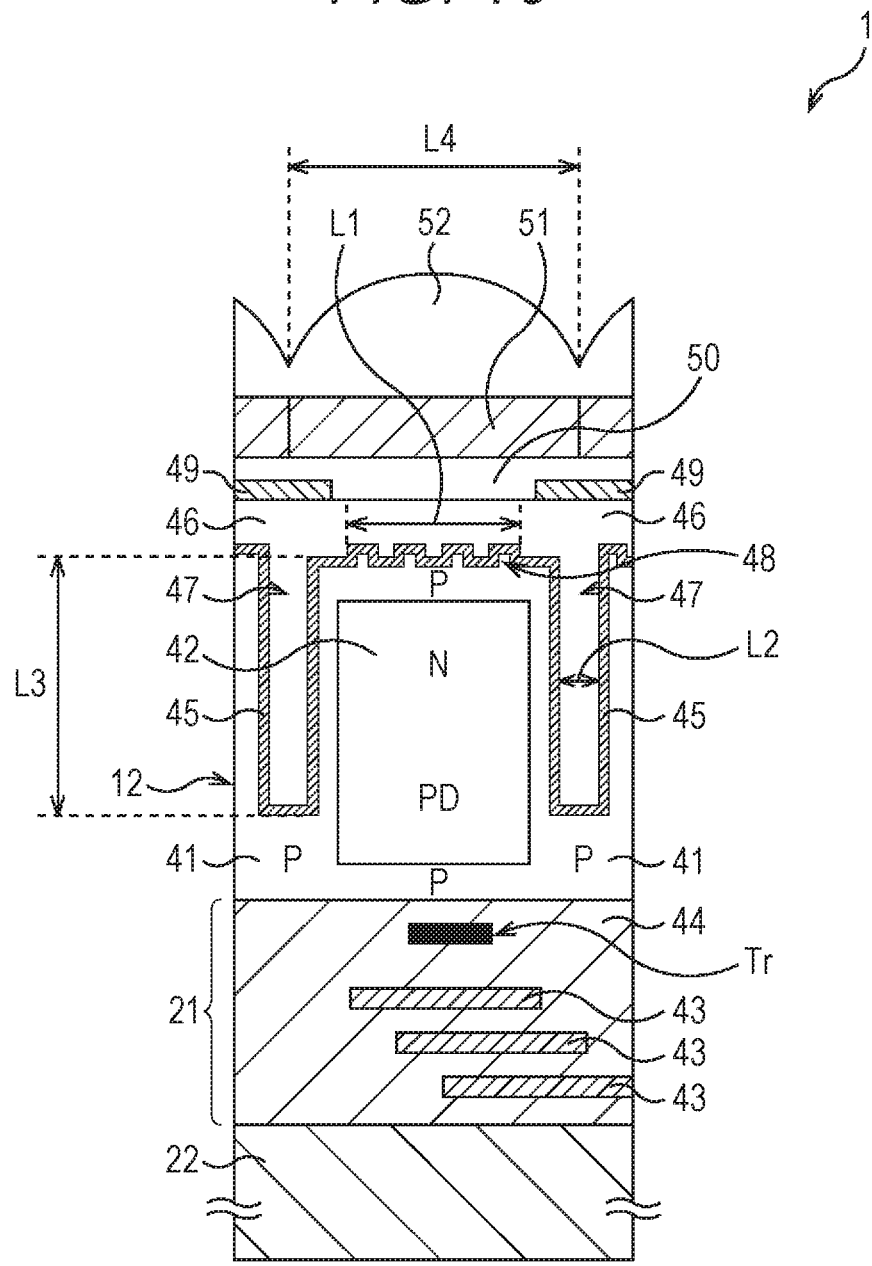
FIG. 10 is a diagram for describing optimum conditions at different positions in the pixel.

Optimum conditions at different positions in the pixel 2 will be described with reference to FIG. 10.

(Moth-Eye Arrangement Region L1 of Anti-Reflection Portion 48)

In the aforementioned embodiments, the anti-reflection portion 48 having the moth-eye structure has been formed on an entire region, on the light-receiving surface side, of the semiconductor regions 41 and 42 in which the photodiode PD is formed. However, as illustrated in FIG. 10, a moth-eye arrangement region L1 (moth-eye arrangement width L1) of the anti-reflection portion 48 can be formed only at a central area of the pixel in a region corresponding to a predetermined percentage of a pixel region L4 (pixel width L4). Furthermore, it is desirable for the moth-eye arrangement region L1 of the anti-reflection portion 48 to be a region corresponding to approximately 80% of the pixel region L4.

The on-chip lens 52 focuses light to the center of a region of a sensor (photodiode PD) serving as the photoelectric conversion region. Thus, strength of light closer to the center of the sensor is higher, and strength of light farther from the center of the sensor is lower. In a region away from the center of the sensor, there are many diffracted light noise components, that is, color mixture noise components toward an adjacent pixel. Accordingly, when the moth-eye structure is not formed in a vicinity of the inter-pixel light-blocking portion 47, diffusion of light can be suppressed and therefore the noise can be suppressed. The moth-eye arrangement region L1 of the anti-reflection portion 48 varies depending on a difference in an upper layer structure such as a pixel size, a curvature of the on-chip lens, and a total thickness of the pixel 2. However, since the on-chip lens 52 typically focuses light to a single spot which is a region corresponding to approximately 80% of a central area of the region of the sensor, it is desirable for the moth-eye arrangement region L1 of the anti-reflection portion 48 to be a region corresponding to approximately 80% of the pixel region L4.

Additionally, a size of a projecting portion (in a spindle shape) of the moth-eye structure can be formed so as to be different for each color. A height, an arrangement area (an area in which the projecting portion is formed in a planar view), and an interval can be defined as the size of the projecting portion.

The height of the projecting portion is reduced for incident light of a shorter wavelength. That is, assuming that a height of a projecting portion of a red pixel 2 is $h_R$, a height of a projecting portion of a green pixel 2 is $h_G$, and a height of a projecting portion of a blue pixel 2 is $h_B$, the heights of the projecting portions of the pixels 2 can be formed so that a size relationship expressed as $h_R > h_G > h_B$ holds.

The arrangement area of the projecting portion is also reduced for incident light of a shorter wavelength. That is, assuming that an arrangement area of a projecting portion of the red pixel 2 is $x_R$, an arrangement area of a projecting portion of the green pixel 2 is $x_G$, and an arrangement area of a projecting portion of the blue pixel 2 is $x_B$, the arrangement areas of the projecting portions of the pixels 2 can be formed so that a size relationship expressed as $x_R > x_G > x_B$ holds. A width of the arrangement area in one direction corresponds to the moth-eye arrangement width L1 in FIG. 10.

The interval of the projecting portion is reduced for incident light of a shorter wavelength. That is, assuming that an interval of a projecting portion of the red pixel 2 is $p_R$, an interval of a projecting portion of the green pixel 2 is $p_G$, and an interval of a projecting portion of the blue pixel 2 is $p_B$, the intervals of the projecting portions of the pixels 2 can be formed so that a size relationship expressed as $p_R > p_G > p_B$ holds.

(Groove Width L2 of Inter-Pixel Light-Blocking Portion 47)

A groove width L2 of the inter-pixel light-blocking portion 47 necessary for preventing incident light from leaking into an adjacent pixel to be totally reflected will be considered.

Assuming that a wavelength λ of incident light is 600 nm, the refraction index n2 of the semiconductor region 41 is 4.0, the refraction index n1 of the inter-pixel light-blocking portion 47 is 1.5 (corresponding to $SiO_2$), and an incident angle θ from the semiconductor region 41 into the inter-pixel light-blocking portion 47 is 60°, the groove width L2 of the inter-pixel light-blocking portion 47 is sufficient at 40 nm or longer. However, from a viewpoint of a margin for satisfying optical properties, and process filling properties, it is desirable for the groove width L2 of the inter-pixel light-blocking portion 47 to be 200 nm or longer.

(Digging Amount L3 of Inter-Pixel Light-Blocking Portion 47)

A digging amount L3 of the inter-pixel light-blocking portion 47 will be considered.

The larger the digging amount L3 of the inter-pixel light-blocking portion 47 becomes, the higher an effect for suppressing color mixture becomes. However, when the digging amount exceeds a predetermined level, the degree of suppression of color mixture becomes saturated. In addition, a focal position and strength of diffusion rely on the wavelength of incident light. More specifically, in the case of a short wavelength, the focal position is high and strength of diffusion is large; accordingly, color mixture in a shallow region is increased and thus the digging amount may be small. On the other hand, in the case of a long wavelength, the focal position is low and strength of diffusion is small; accordingly, color mixture in a deep region is increased and thus the digging amount is required to be large. Considering the situation described above, it is desirable for the digging amount L3 of the inter-pixel light-blocking portion 47 to be equal to or longer than the wavelength of incident light. For example, it is desirable that a digging amount L3 for the blue pixel 2 be 450 nm or longer, a digging amount L3 for the green pixel 2 be 550 nm or longer, and a digging amount L3 for the red pixel 2 be 650 nm or longer.

In the description above, in order not only to utilize the waveguide function to the maximum extent but also not to reduce an area for the sensor, the inter-pixel light-blocking portion 47 has had a digging shape without a taper, formed through the anisotropic dry etching processing.

However, as long as an area for the photodiode PD is not affected even if the inter-pixel light-blocking portion 47 is formed into a taper shape because the inter-pixel light-blocking portion 47 and the N-type semiconductor region 42 are sufficiently apart from each other, the inter-pixel light-blocking portion 47 may be in a taper shape. For example, assuming that the refraction index n1 of the inter-pixel light-blocking portion 47 is 1.5 (corresponding to $SiO_2$), and the refraction index n2 of the P-type semiconductor region 41 is 4.0, a boundary reflection index is extremely high and thus the inter-pixel light-blocking portion 47 can be in a normal taper shape or a reverse taper shape within a range from 0° to 30°.

<4. Variations of Pixel Structure>

A plurality of variations of the pixel structure will be described with reference to FIGS. 11 to 26. In FIGS. 11 to 26, pixel structures illustrated more simply than the exemplary cross-sectional structures illustrated in FIGS. 2 and 8 are used for description, and even the respective corresponding constituent members are given different reference numerals in some cases.

Figure 11:
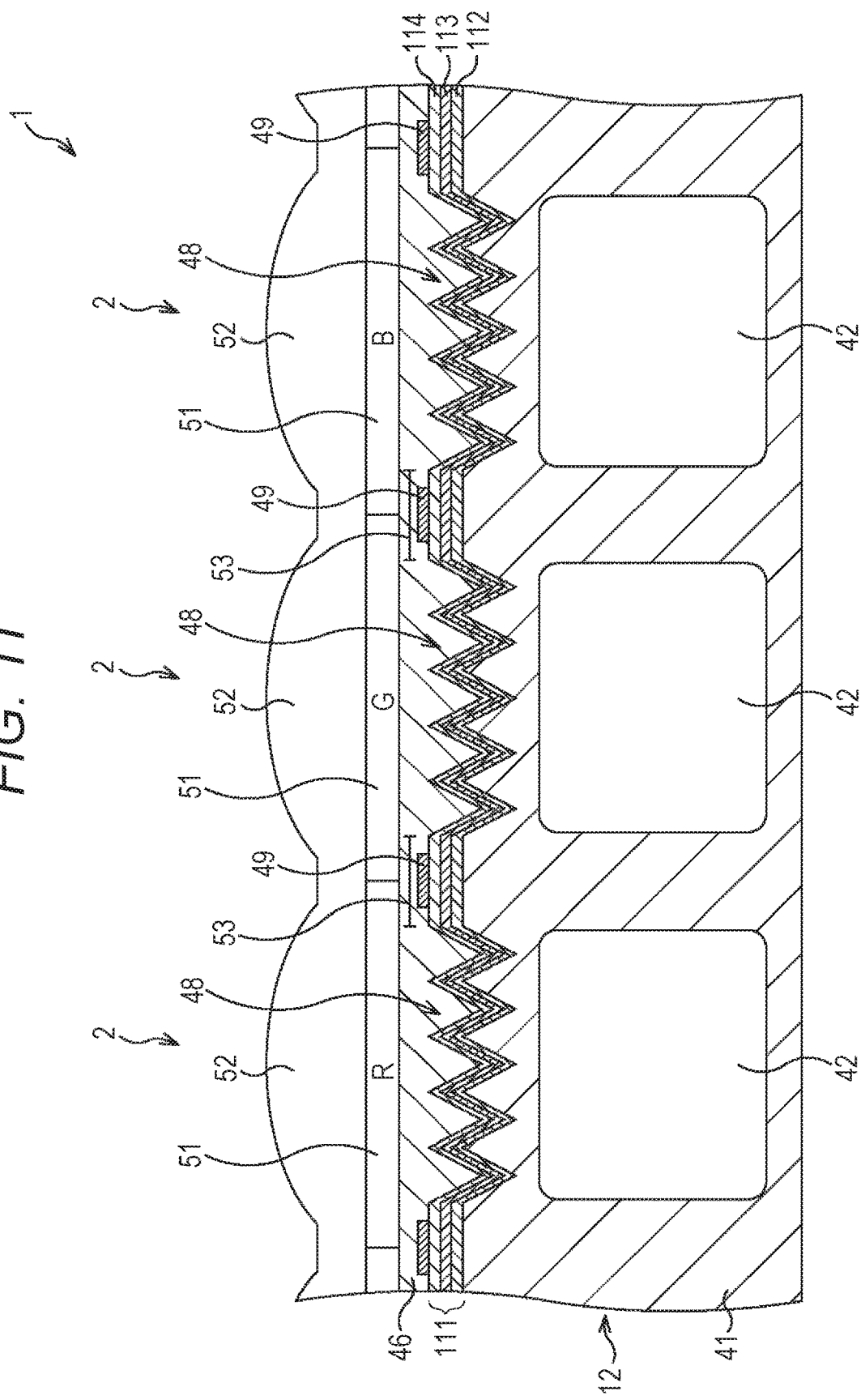
FIG. 11 is a diagram illustrating a first variation of the pixel structure.

FIG. 11 is a diagram illustrating a first variation of the pixel structure.

First, a basic structure common to each variation of the pixel structure described below will be described hereinafter with reference to FIG. 11.

As illustrated in FIG. 11, a solid-state imaging device 1 includes a semiconductor substrate 12 in which an N-type semiconductor region 42 constituting a photodiode PD is formed for each pixel 2. An anti-reflection film 111, a transparent insulation film 46, a color filter layer 51, and an on-chip lens 52 are laminated onto the semiconductor substrate 12.

The anti-reflection film 111 has a lamination structure obtained by laminating, for example, a fixed charge film and an oxide film, and a high-dielectric (high-k) insulation thin film formed through, for example, an atomic layer deposition (ALD) method can be used. More specifically, hafnium oxide ($HfO_2$), aluminum oxide ($Al_2O_3$), titanium oxide ($TiO_2$), strontium titan oxide (STO), or the like can be used. In an example illustrated in FIG. 11, the anti-reflection film 111 is configured by laminating a hafnium oxide film 112, an aluminum oxide film 113, and a silicon oxide film 114.

Additionally, a light-blocking film 49 is formed between the pixels 2 so as to be laminated on the anti-reflection film 111. A single-layer metal film of titanium (Ti), titanium nitride (TiN), tungsten (W), aluminum (Al), tungsten nitride (WN), or the like is used for the light-blocking film 49. Alternatively, a laminated film of these types of metal (for example, a laminated film of titanium and tungsten or a laminated film of titanium nitride and tungsten) may be used as the light-blocking film 49.

In the first variation of the pixel structure in the solid-state imaging device 1 configured as described above, a flat portion 53 is provided by a region of a predetermined width, in which an anti-reflection portion 48 is not formed between the pixels 2 on a boundary surface on a light-receiving surface side of the semiconductor substrate 12. As described above, the anti-reflection portion 48 is provided by forming the moth-eye structure (fine uneven structure), which is not formed between the region between the pixels 2 to leave a flat surface; as a result, the flat portion 53 is provided. In this manner, the flat portion 53 is provided in the pixel structure; therefore, generation of diffracted light can be suppressed in the region of the predetermined width (pixel separation region), which is a vicinity of another adjacent pixel 2, to thereby prevent generation of color mixture.

In other words, in the case of the semiconductor substrate 12 formed with the moth-eye structure, it is known that diffraction of vertical incident light is generated, and diffracted light component becomes larger, for example, as the interval of the moth-eye structure is increased, whereby a percentage of light entering another adjacent pixel 2 is increased.

Compared to this, the solid-state imaging device 1 is provided with the flat portion 53 in the region of the predetermined width between the pixels 2, in which diffracted light easily leaks into another adjacent pixel 2, so that diffraction of vertical incident light is not generated in the flat portion 53 and thus generation of color mixture can be prevented.

Figure 12:
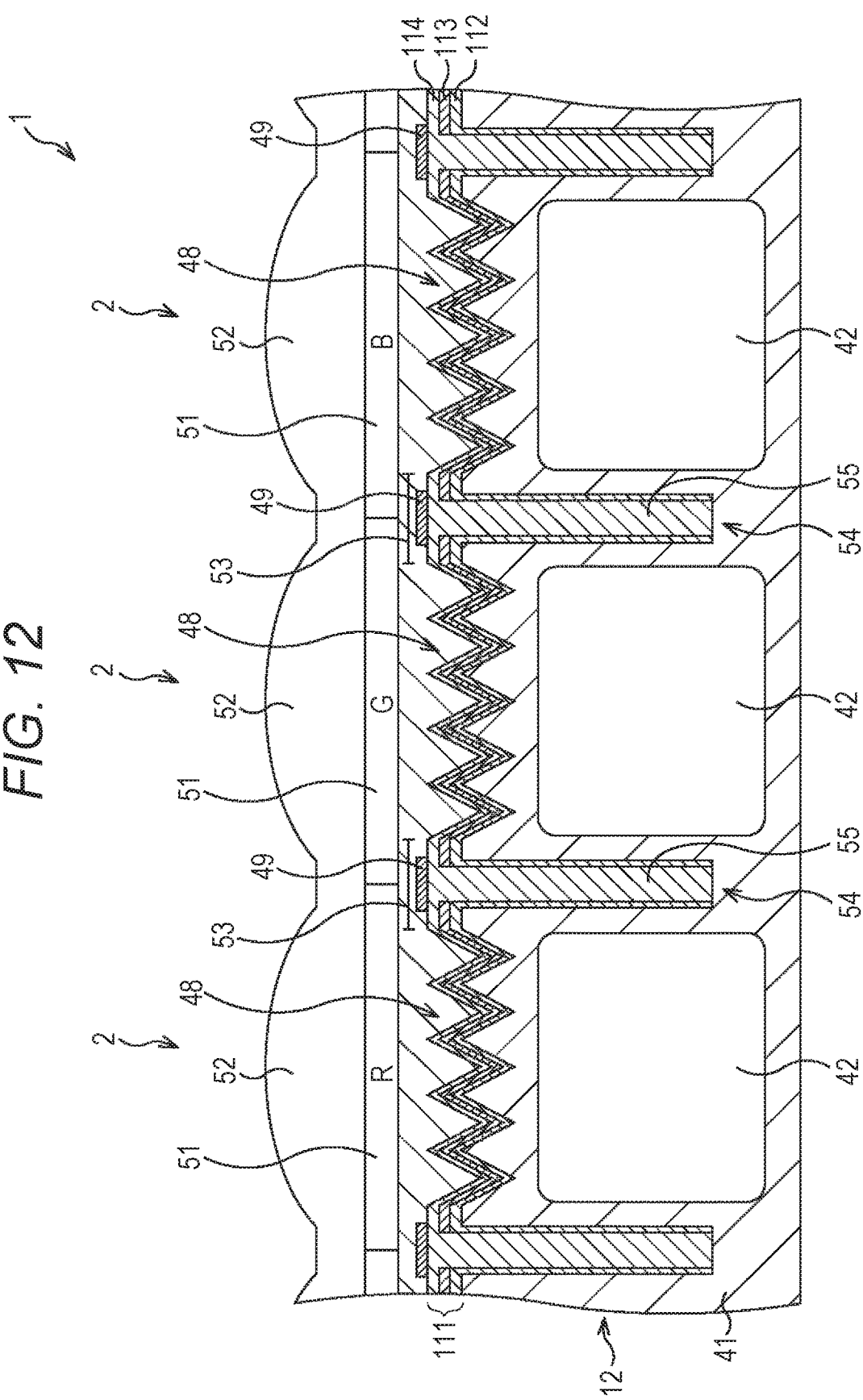
FIG. 12 is a diagram illustrating a second variation of the pixel structure.

FIG. 12 is a diagram illustrating a second variation of the pixel structure.

In FIG. 12, a basic structure of a solid-state imaging device 1 is common to the structure illustrated in FIG. 11. In addition, in the second variation of the pixel structure, a pixel separation portion 54 that separates between the pixels 2 in a semiconductor substrate 12 is formed.

The pixel separation portion 54 is formed by digging a trench between N-type semiconductor regions 42 constituting photodiodes PD, forming an aluminum oxide film 113 on an internal surface of the trench, and further filling the trench with an insulating material 55 when forming a silicon oxide film 114.

By configuring such pixel separation portion 54, the pixels 2 being adjacent to each other are electrically separated from each other by the insulating material 55 filling the trench. With this, a charge generated within the semiconductor substrate 12 can be prevented from leaking into an adjacent pixel 2.

Additionally, also in the second variation of the pixel structure, a flat portion 53 can be provided in the pixel structure to suppress generation of diffracted light in the pixel separation region, thereby preventing color mixture from being generated.

Figure 13:
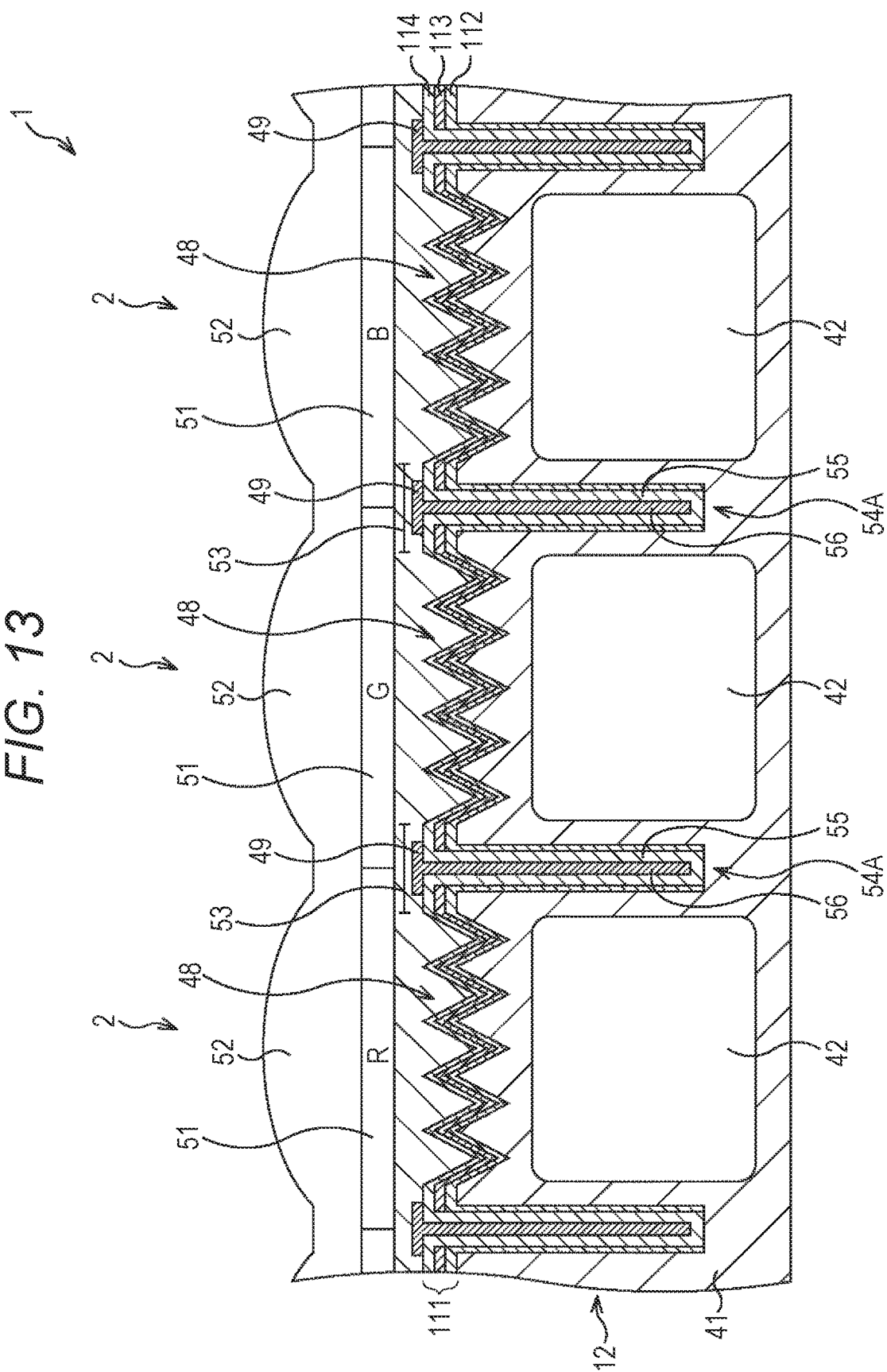
FIG. 13 is a diagram illustrating a third variation of the pixel structure.

FIG. 13 is a diagram illustrating a third variation of the pixel structure.

In FIG. 13, a basic structure of a solid-state imaging device 1 is common to the structure illustrated in FIG. 11. In addition, in the third variation of the pixel structure, a pixel separation portion 54A that separates between the pixels 2 in a semiconductor substrate 12 is formed.

The pixel separation portion 54A is formed by digging a trench between N-type semiconductor regions 42 constituting photodiodes PD, forming an aluminum oxide film 113 on an internal surface of the trench, filling the trench with an insulating material 55 when forming a silicon oxide film 114, and further filling the inside of the insulating material 55 with a light-blocking material 56 when forming a light-blocking film 49. The light-blocking material 56 is integrally formed with the light-blocking film 49 using metal with light-blocking properties.

By configuring such pixel separation portion 54A, the pixels 2 being adjacent to each other are electrically separated from each other by the insulating material 55 filling the trench, while being optically separated by the light-blocking material 56. With this, a charge generated within the semiconductor substrate 12 can be prevented from leaking into an adjacent pixel 2, and diagonally incident light can be prevented as well from leaking into an adjacent pixel 2.

Additionally, also in the third variation of the pixel structure, a flat portion 53 can be provided in the pixel structure to suppress generation of diffracted light in the pixel separation region, thereby preventing color mixture from being generated.

Figure 14:
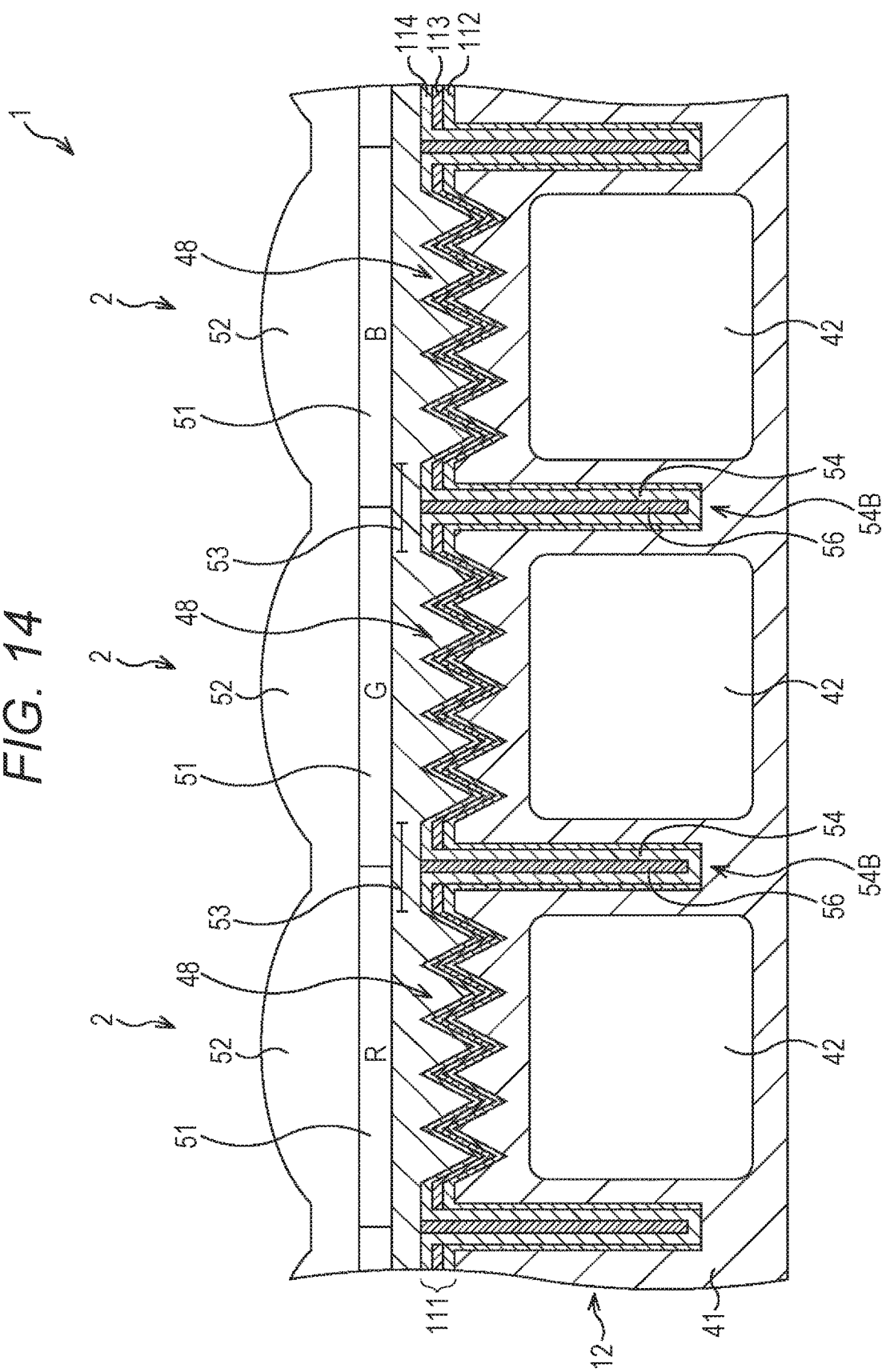
FIG. 14 is a diagram illustrating a fourth variation of the pixel structure.

FIG. 14 is a diagram illustrating a fourth variation of the pixel structure.

In FIG. 14, a basic structure of a solid-state imaging device 1 is common to the structure illustrated in FIG. 11. In addition, in the fourth variation of the pixel structure, a pixel separation portion 54B that separates between the pixels 2 in a semiconductor substrate 12 is formed.

The pixel separation portion 54B is formed by digging a trench between N-type semiconductor regions 42 constituting photodiodes PD, forming an aluminum oxide film 113 on an internal surface of the trench, filling the trench with an insulating material 55 when forming a silicon oxide film 114, and further filling the trench with a light-blocking material 56. In a configuration with the pixel separation portion 54B, a light-blocking film 49 is not provided in a flat portion 53.

By configuring such pixel separation portion 54B, the pixels 2 being adjacent to each other are electrically separated from each other by the insulating material 55 filling the trench, while being optically separated by the light-blocking material 56. With this, a charge generated within the semiconductor substrate 12 can be prevented from leaking into an adjacent pixel 2, and diagonally incident light can be prevented as well from leaking into an adjacent pixel 2.

Additionally, also in the fourth variation of the pixel structure, the flat portion 53 can be provided in the pixel structure to suppress generation of diffracted light in the pixel separation region, thereby preventing color mixture from being generated.

Figure 15:
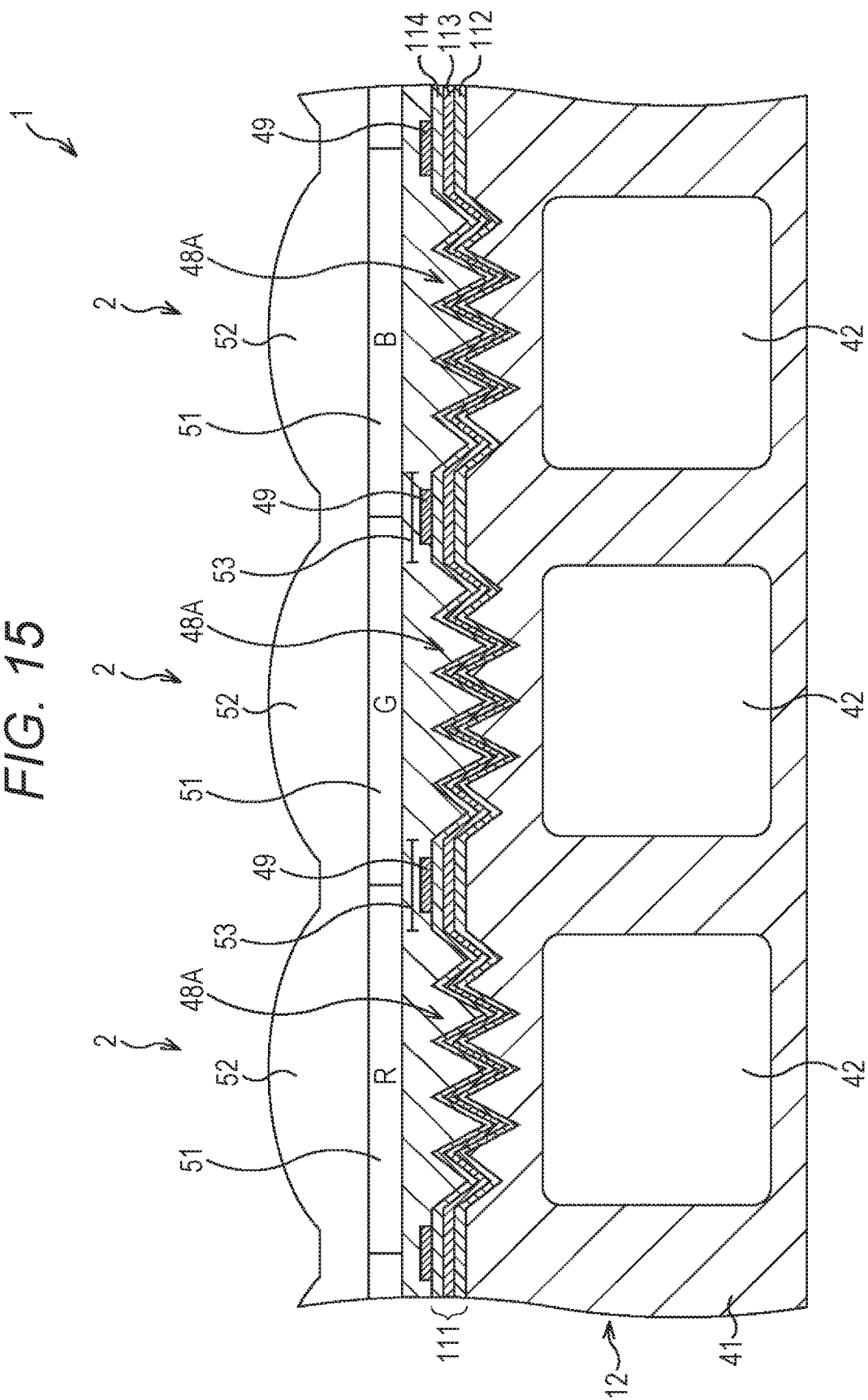
FIG. 15 is a diagram illustrating a fifth variation of the pixel structure.

FIG. 15 is a diagram illustrating a fifth variation of the pixel structure.

In FIG. 15, a basic structure of a solid-state imaging device 1 is common to the structure illustrated in FIG. 11. In addition, in the fifth variation of the pixel structure, a shape of an anti-reflection portion 48A is formed so that a depth of an unevenness constituting the moth-eye structure is reduced in a vicinity of a periphery of a pixel 2.

In other words, as illustrated in FIG. 15, the anti-reflection portion 48A is formed with an unevenness constituting the moth-eye structure of a shallower depth in an area surrounding the pixel 2, that is, an area in a vicinity of another adjacent pixel 2, compared to, for example, the anti-reflection portion 48 illustrated in FIG. 11.

As described above, by forming the unevenness of a shallower depth in an area surrounding the pixel 2, generation of diffracted light can be suppressed in a periphery thereof. Additionally, also in the fifth variation of the pixel structure, a flat portion 53 can be provided in the pixel structure to suppress generation of diffracted light in the pixel separation region, thereby further preventing color mixture from being generated.

Figure 16:
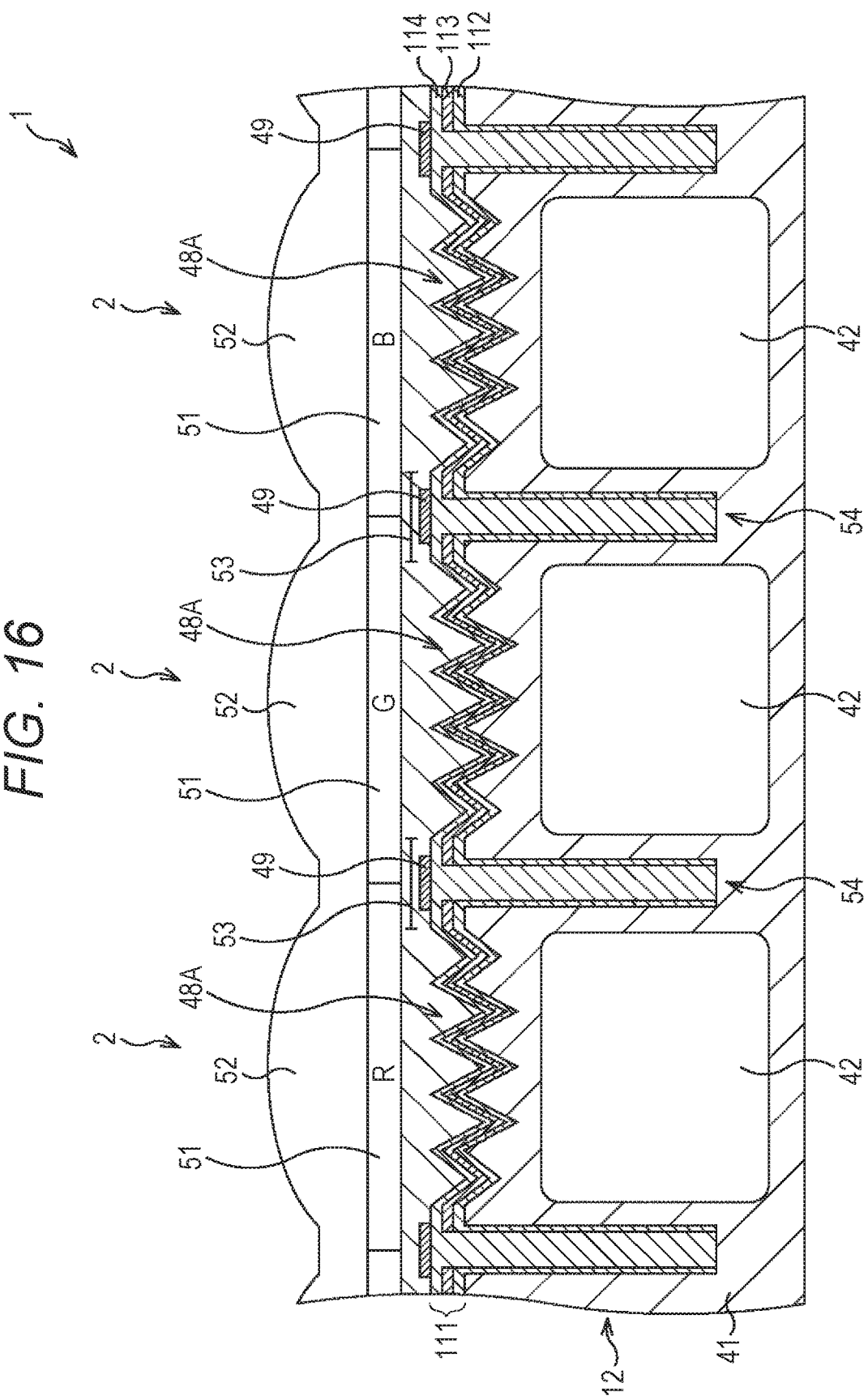
FIG. 16 is a diagram illustrating a sixth variation of the pixel structure.

FIG. 16 is a diagram illustrating a sixth variation of the pixel structure.

In FIG. 16, a basic structure of a solid-state imaging device 1 is common to the structure illustrated in FIG. 11. In addition, in the sixth variation of the pixel structure, a shape of an anti-reflection portion 48A is formed so that a depth of an unevenness constituting the moth-eye structure is reduced in a periphery of a pixel 2, and a pixel separation portion 54 is formed as well.

By configuring such anti-reflection portion 48A, generation of diffracted light can be suppressed in an area surrounding the pixel 2, while the pixels 2 being adjacent to each other can be electrically separated from each other by the pixel separation portion 54. Additionally, also in the sixth variation of the pixel structure, a flat portion 53 can be provided in the pixel structure to suppress generation of diffracted light in the pixel separation region, thereby further preventing color mixture from being generated.

Figure 17:
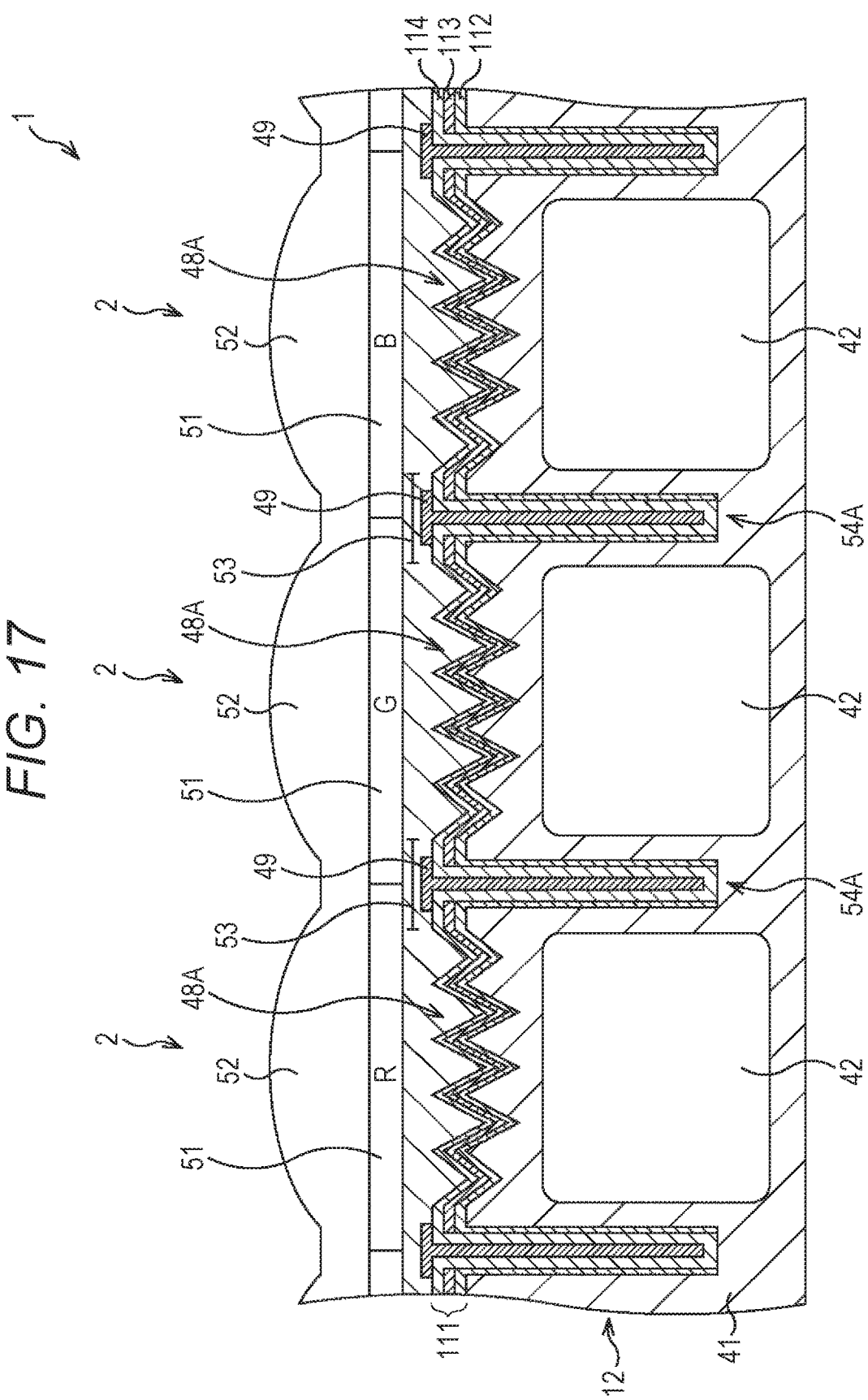
FIG. 17 is a diagram illustrating a seventh variation of the pixel structure.

FIG. 17 is a diagram illustrating a seventh variation of the pixel structure.

In FIG. 17, a basic structure of a solid-state imaging device 1 is common to the structure illustrated in FIG. 11. In addition, in the seventh variation of the pixel structure, a shape of an anti-reflection portion 48A is formed so that a depth of an unevenness constituting the moth-eye structure is reduced in a vicinity of a periphery of a pixel 2, and a pixel separation portion 54A is formed as well.

By configuring such anti-reflection portion 48A, generation of diffracted light can be suppressed in an area surrounding the pixel 2, while the pixels 2 being adjacent to each other can be electrically and optically separated from each other by the pixel separation portion 54A. Additionally, also in the seventh variation of the pixel structure, a flat portion 53 can be provided in the pixel structure to suppress generation of diffracted light in the pixel separation region, thereby further preventing color mixture from being generated.

Figure 18:
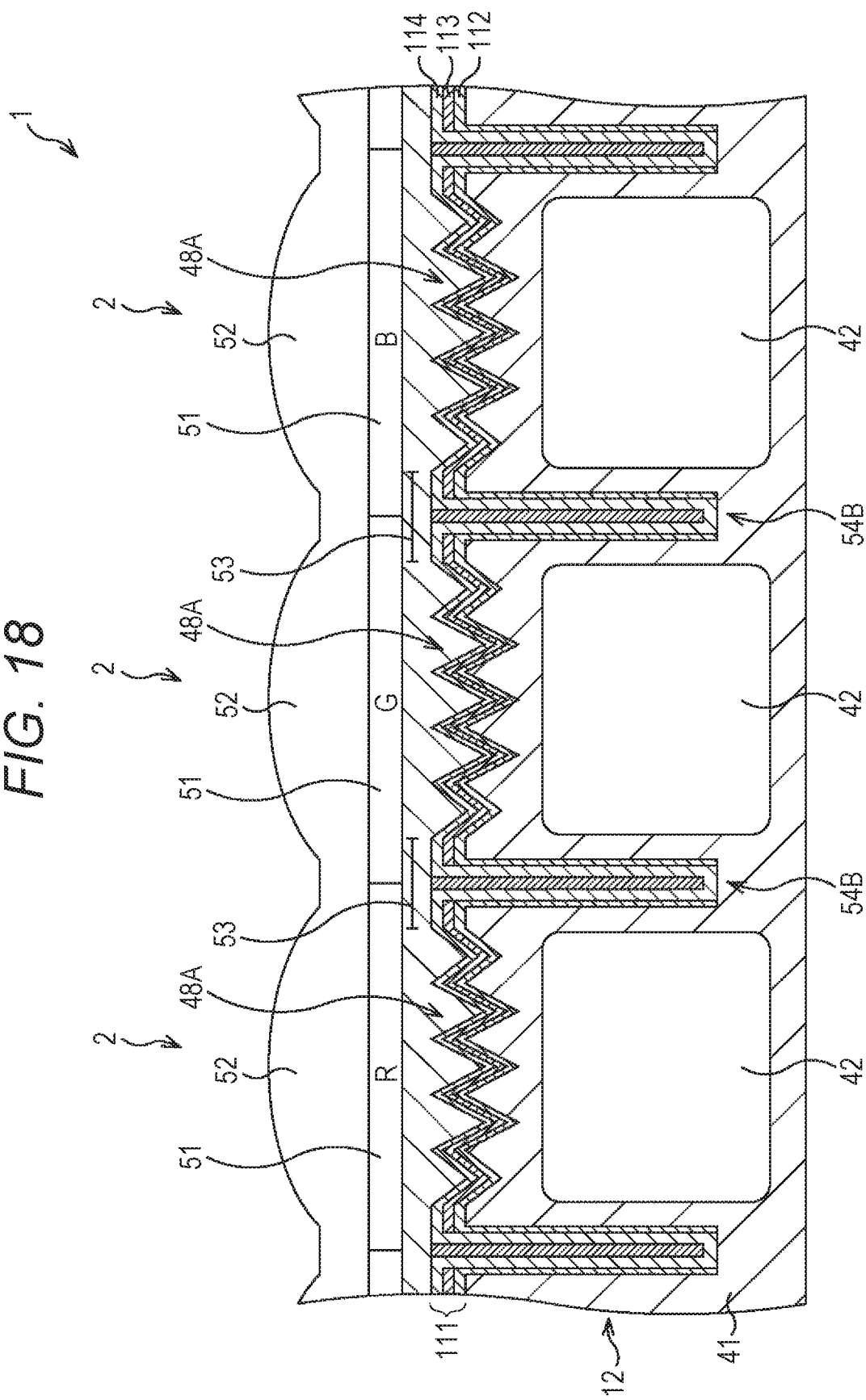
FIG. 18 is a diagram illustrating an eighth variation of the pixel structure.

FIG. 18 is a diagram illustrating an eighth variation of the pixel structure.

In FIG. 18, a basic structure of a solid-state imaging device 1 is common to the structure illustrated in FIG. 11. In addition, in the eighth variation of the pixel structure, a shape of an anti-reflection portion 48A is formed so that a depth of an unevenness constituting the moth-eye structure is reduced in a vicinity of a periphery of a pixel 2, and a pixel separation portion 54B is formed as well.

By configuring such anti-reflection portion 48A, generation of diffracted light can be suppressed in an area surrounding the pixel 2, while the pixels 2 being adjacent to each other can be electrically and optically separated from each other by the pixel separation portion 54B. Additionally, also in the eighth variation of the pixel structure, a flat portion 53 can be provided in the pixel structure to suppress generation of diffracted light in the pixel separation region, thereby further preventing color mixture from being generated.

Figure 19:
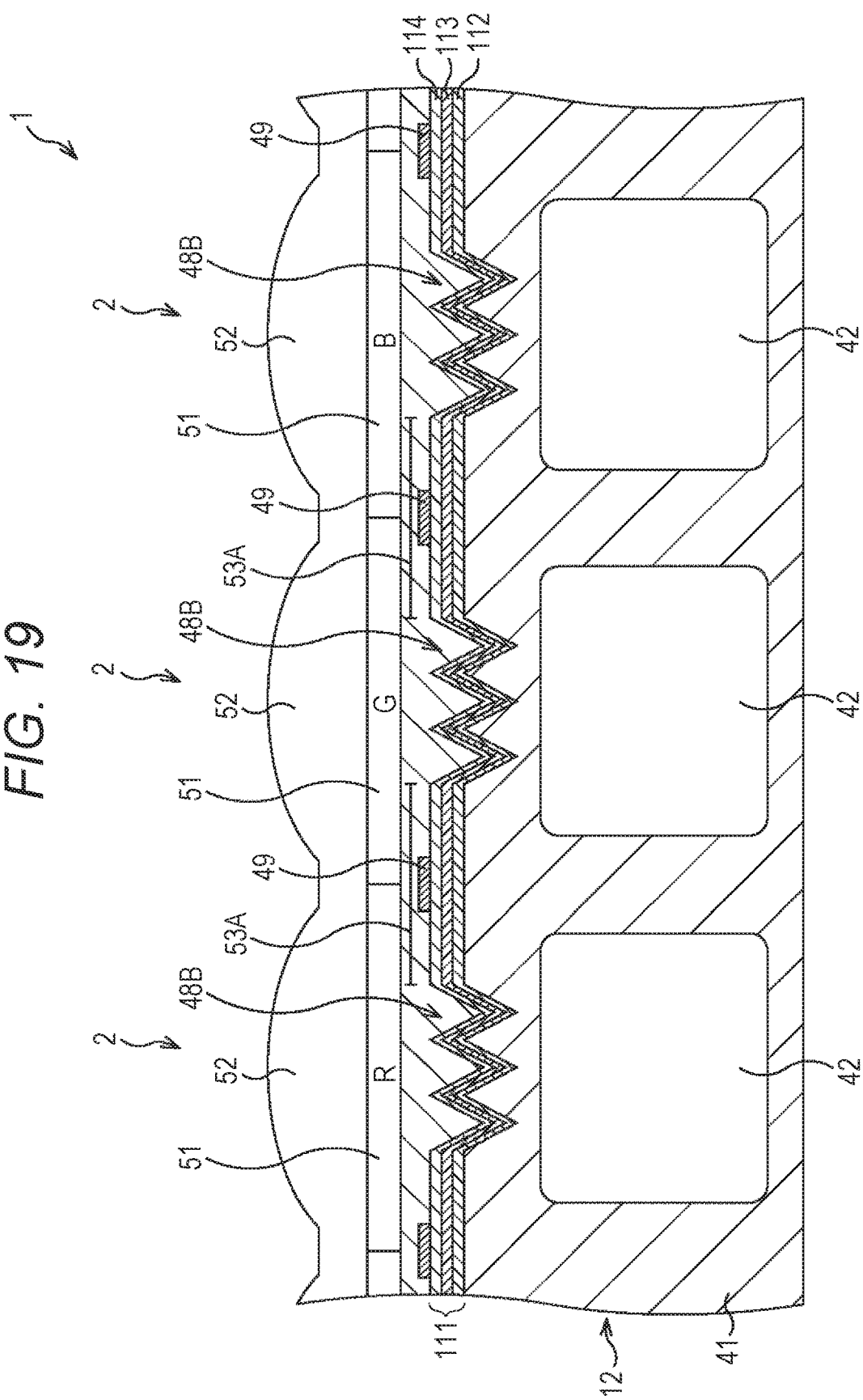
FIG. 19 is a diagram illustrating a ninth variation of the pixel structure.

FIG. 19 is a diagram illustrating a ninth variation of the pixel structure.

In FIG. 19, a basic structure of a solid-state imaging device 1 is common to the structure illustrated in FIG. 11. In addition, in the ninth variation of the pixel structure, an anti-reflection portion 48B is formed in a smaller region than, for example, the anti-reflection portion 48 in FIG. 11.

In other words, as illustrated in FIG. 19, a region of the anti-reflection portion 48B, in which the moth-eye structure is formed, is reduced in an area surrounding a pixel 2, that is, an area in a vicinity of another adjacent pixel 2, compared to, for example, the anti-reflection portion 48 illustrated in FIG. 11. As a result, a flat portion 53A is formed in a larger area than the flat portion 53 in FIG. 11.

As described above, by not forming the moth-eye structure in an area surrounding the pixel 2 to provide the flat portion 53A in a larger area, generation of diffracted light can be suppressed in a periphery thereof. With this, also in the ninth variation of the pixel structure, generation of diffracted light can be suppressed in the pixel separation region to further prevent color mixture from being generated.

Figure 20:
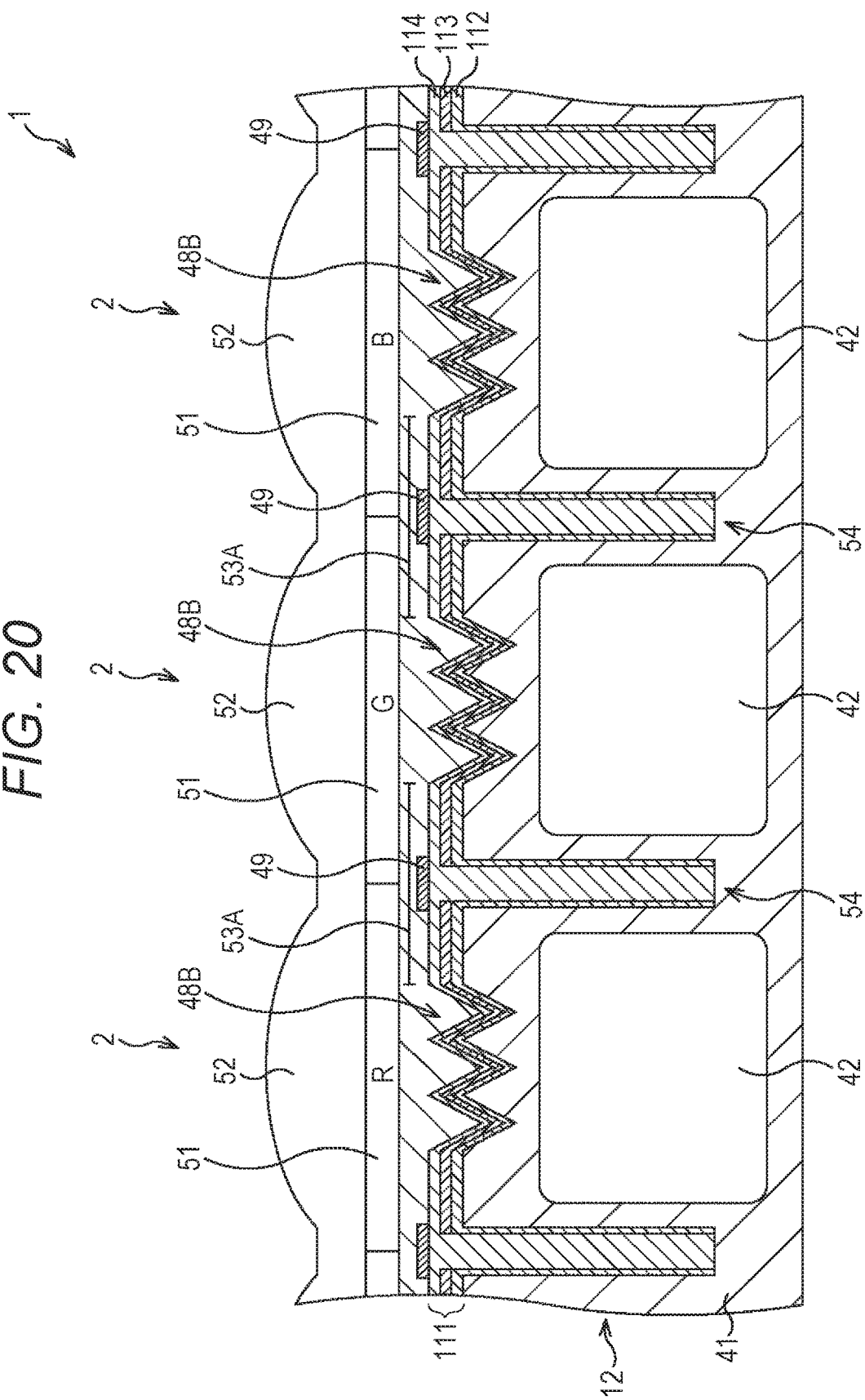
FIG. 20 is a diagram illustrating a tenth variation of the pixel structure.

FIG. 20 is a diagram illustrating a tenth variation of the pixel structure.

In FIG. 20, a basic structure of a solid-state imaging device 1 is common to the structure illustrated in FIG. 11. In addition, in the tenth variation of the pixel structure, an anti-reflection portion 48B is formed in a smaller region, and a pixel separation portion 54 is formed as well.

By configuring such anti-reflection portion 48B, generation of diffracted light can be suppressed in an area surrounding a pixel 2, while the pixels 2 being adjacent to each other can be electrically separated from each other by the pixel separation portion 54. Additionally, also in the tenth variation of the pixel structure, a flat portion 53A can be provided in a larger area in the pixel structure to suppress generation of diffracted light in the pixel separation region, thereby further preventing color mixture from being generated.

Figure 21:
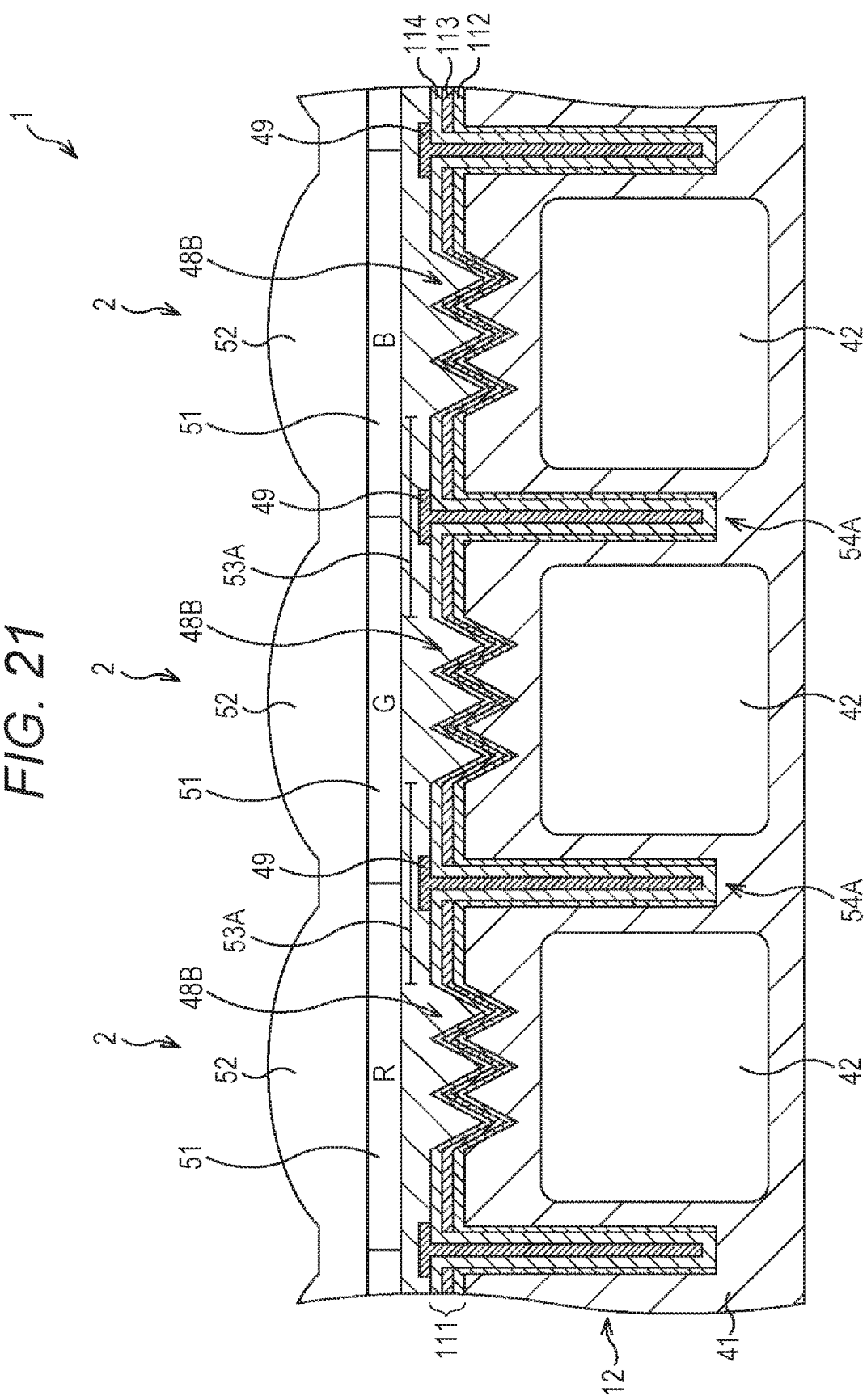
FIG. 21 is a diagram illustrating an eleventh variation of the pixel structure.

FIG. 21 is a diagram illustrating an eleventh variation of the pixel structure.

In FIG. 21, a basic structure of a solid-state imaging device 1 is common to the structure illustrated in FIG. 11. In addition, in the eleventh variation of the pixel structure, an anti-reflection portion 48B is formed in a smaller region, and a pixel separation portion 54A is formed as well.

By configuring such anti-reflection portion 48B, generation of diffracted light can be suppressed in an area surrounding a pixel 2, while the pixels 2 being adjacent to each other can be electrically and optically separated from each other by the pixel separation portion 54A. Additionally, also in the twenty-first variation of the pixel structure, a flat portion 53A can be provided in a larger area in the pixel structure to suppress generation of diffracted light in the pixel separation region, thereby further preventing color mixture from being generated.

Figure 22:
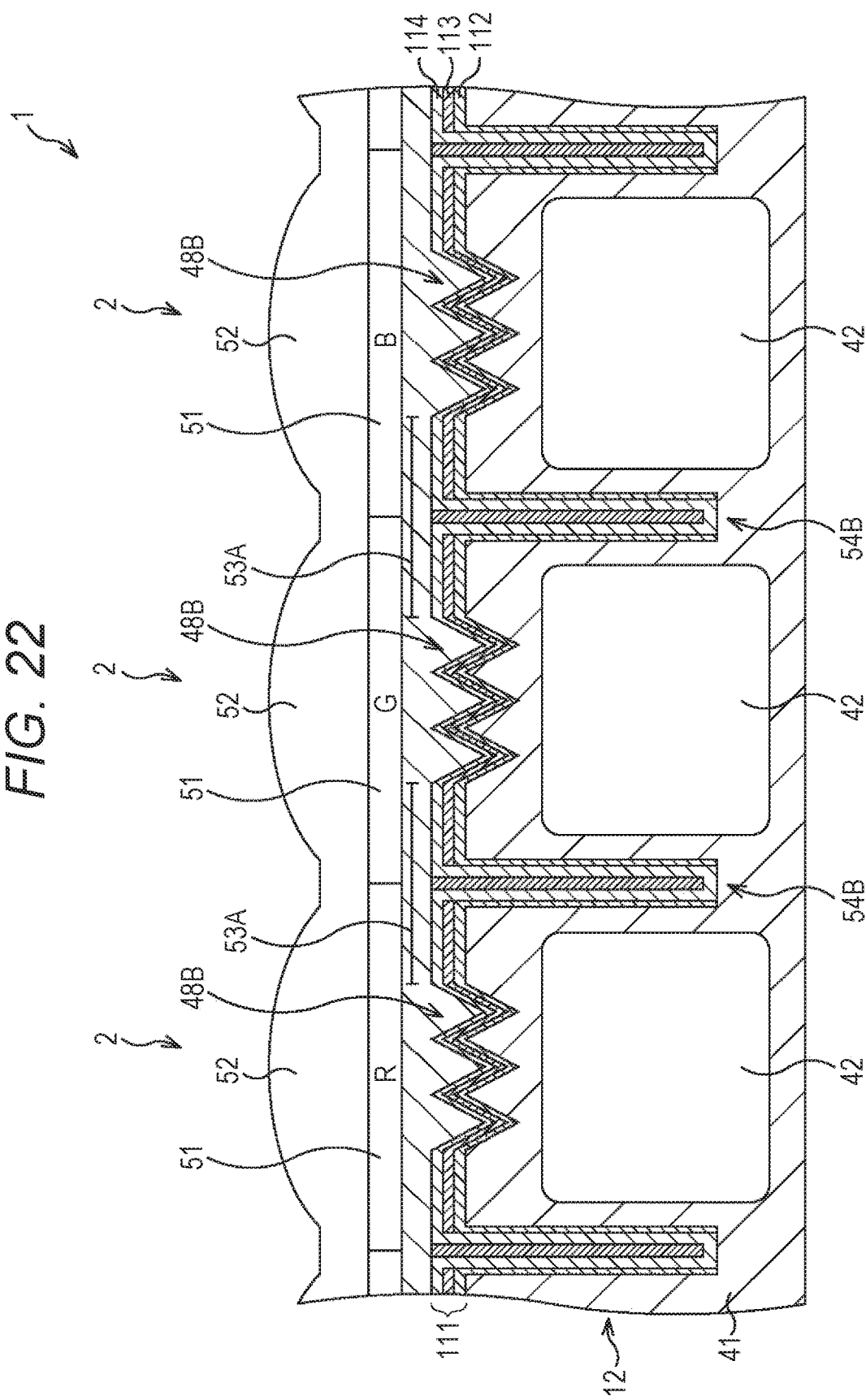
FIG. 22 is a diagram illustrating a twelfth variation of the pixel structure.

FIG. 22 is a diagram illustrating a twelfth variation of the pixel structure.

In FIG. 22, a basic structure of a solid-state imaging device 1 is common to the structure illustrated in FIG. 11. In addition, in the twelfth variation of the pixel structure, an anti-reflection portion 48B is formed in a smaller region, and a pixel separation portion 54B is formed as well.

By configuring such anti-reflection portion 48B, generation of diffracted light can be suppressed in an area surrounding a pixel 2, while the pixels 2 being adjacent to each other can be electrically and optically separated from each other by the pixel separation portion 54B. Additionally, also in the twenty-first variation of the pixel structure, a flat portion 53A can be provided in a larger area in the pixel structure to suppress generation of diffracted light in the pixel separation region, thereby further preventing color mixture from being generated.

Figure 23:
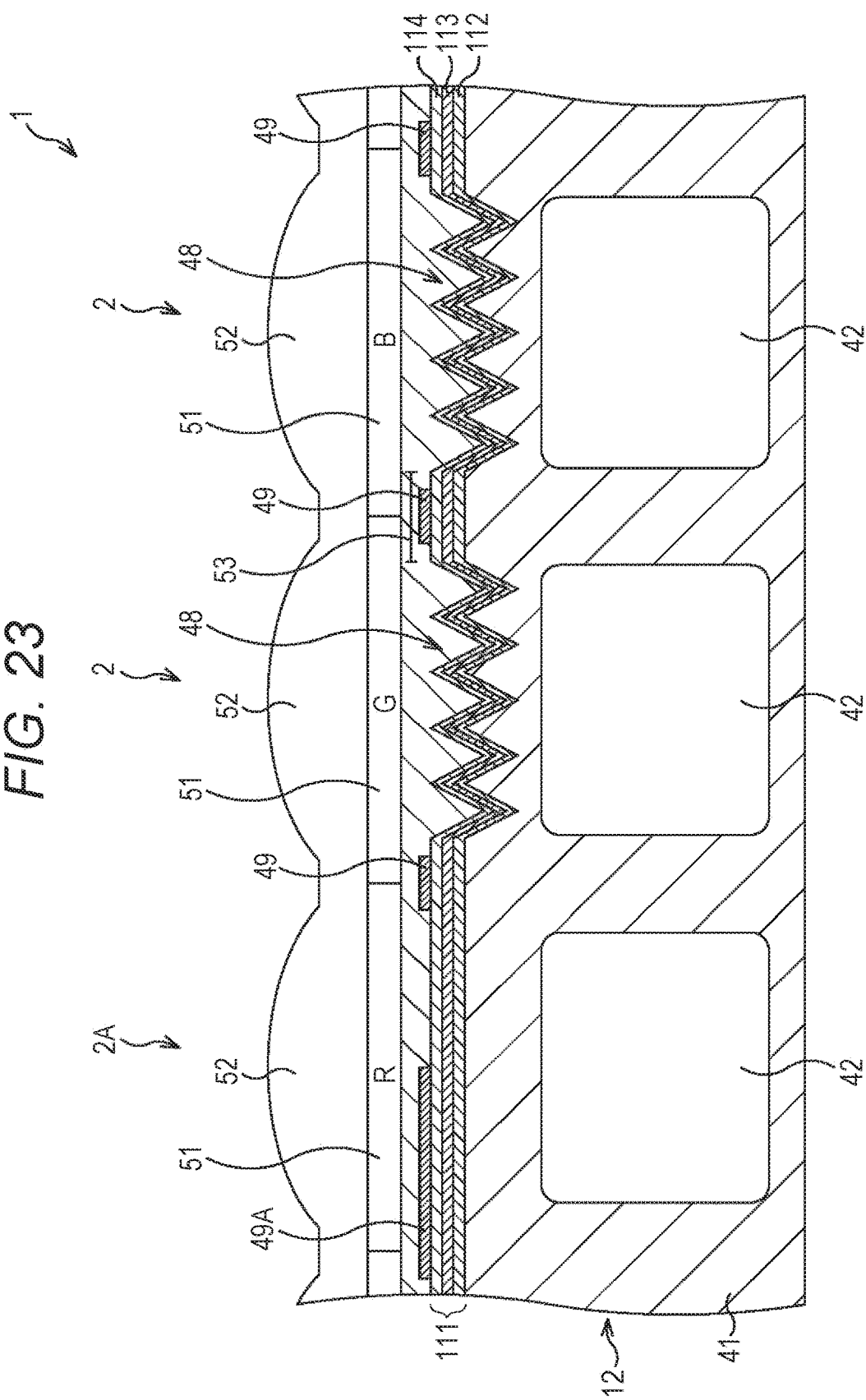
FIG. 23 is a diagram illustrating a thirteenth variation of the pixel structure.

FIG. 23 is a diagram illustrating a thirteenth variation of the pixel structure.

In FIG. 23, a basic structure of a solid-state imaging device 1 is common to the structure illustrated in FIG. 11. In addition, in the thirteenth variation of the pixel structure, a phase difference pixel 2A used for image plane phase difference auto focus (AF) is disposed, and an anti-reflection portion 48 is not provided in the phase difference pixel 2A. The phase difference pixel 2A outputs a signal for controlling auto focus using a phase difference in an image plane, and a boundary surface thereof on a light-receiving surface side is formed into a flat surface, since the anti-reflection portion 48 is not provided.

As illustrated in FIG. 23, in the phase difference pixel 2A used for the image plane phase difference AF, a light-blocking film 49A is formed so as to block light on substantially a half of an opening. For example, a pair of a phase difference pixel 2A whose right half is blocked from light and a phase difference pixel 2A whose left half is blocked from light is used for measuring the phase difference and signals output from the phase difference pixels 2A are not used for creating an image.

Additionally, also in the thirteenth variation of the pixel structure including such phase difference pixel 2A used for the image plane phase difference AF, a flat portion 53 can be provided in the pixel structure between pixels 2 other than the phase difference pixels 2A to suppress generation of diffracted light in the pixel separation region, thereby preventing color mixture from being generated.

Figure 24:
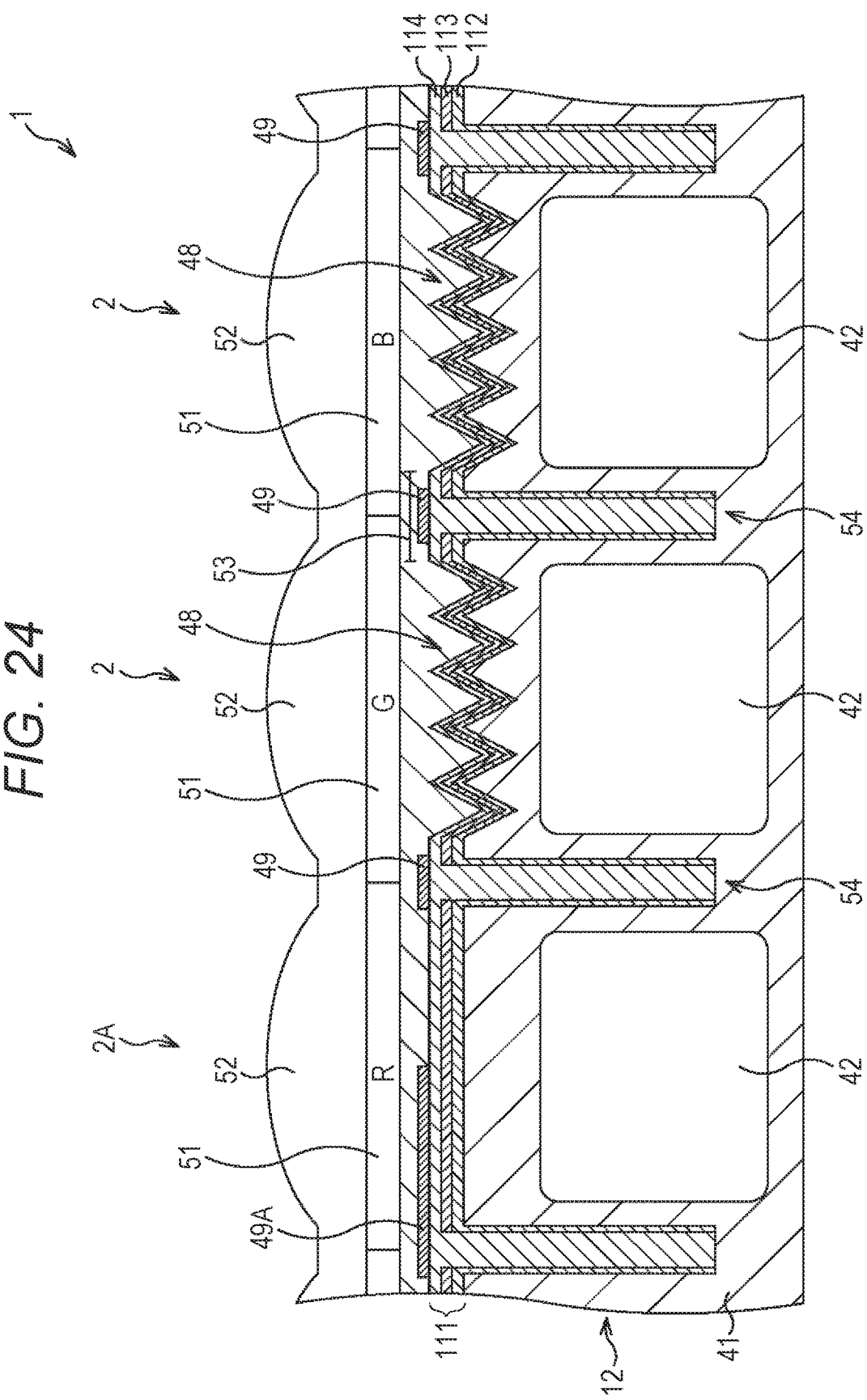
FIG. 24 is a diagram illustrating a fourteenth variation of the pixel structure.

FIG. 24 is a diagram illustrating a fourteenth variation of the pixel structure.

In FIG. 24, a basic structure of a solid-state imaging device 1 is common to the structure illustrated in FIG. 11. In addition, in the fourteenth variation of the pixel structure, an anti-reflection portion 48 is not provided in a phase difference pixel 2A used for the image plane phase difference AF, while a pixel separation portion 54 is formed.

Thus, also in the fourteenth variation of the pixel structure, pixels 2 being adjacent to each other can be electrically separated from each other by the pixel separation portion 54, and a flat portion 53 can be provided in the pixel structure between the pixels 2 other than the phase difference pixels 2A to suppress generation of diffracted light in the pixel separation region, thereby preventing color mixture from being generated.

Figure 25:
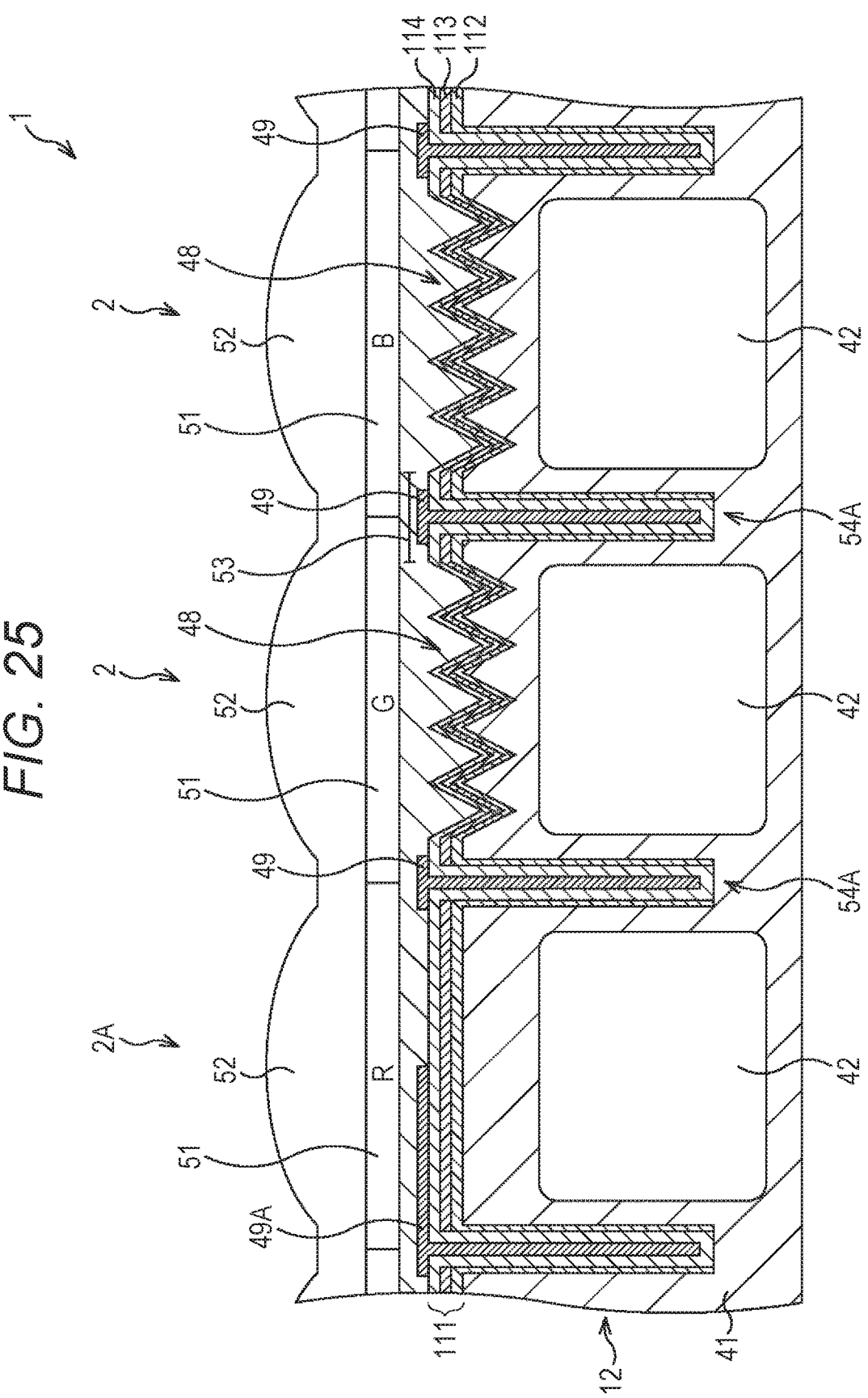
FIG. 25 is a diagram illustrating a fifteenth variation of the pixel structure.

FIG. 25 is a diagram illustrating a fifteenth variation of the pixel structure.

In FIG. 25, a basic structure of a solid-state imaging device 1 is common to the structure illustrated in FIG. 11. In addition, in the fifteenth variation of the pixel structure, an anti-reflection portion 48 is not provided in a phase difference pixel 2A used for the image plane phase difference AF, while a pixel separation portion 54A is formed.

Thus, also in the fifteenth variation of the pixel structure, pixels 2 being adjacent to each other can be electrically and optically separated from each other by the pixel separation portion 54A, and a flat portion 53 can be provided in the pixel structure between the pixels 2 other than the phase difference pixels 2A to suppress generation of diffracted light in the pixel separation region, thereby preventing color mixture from being generated.

Figure 26:
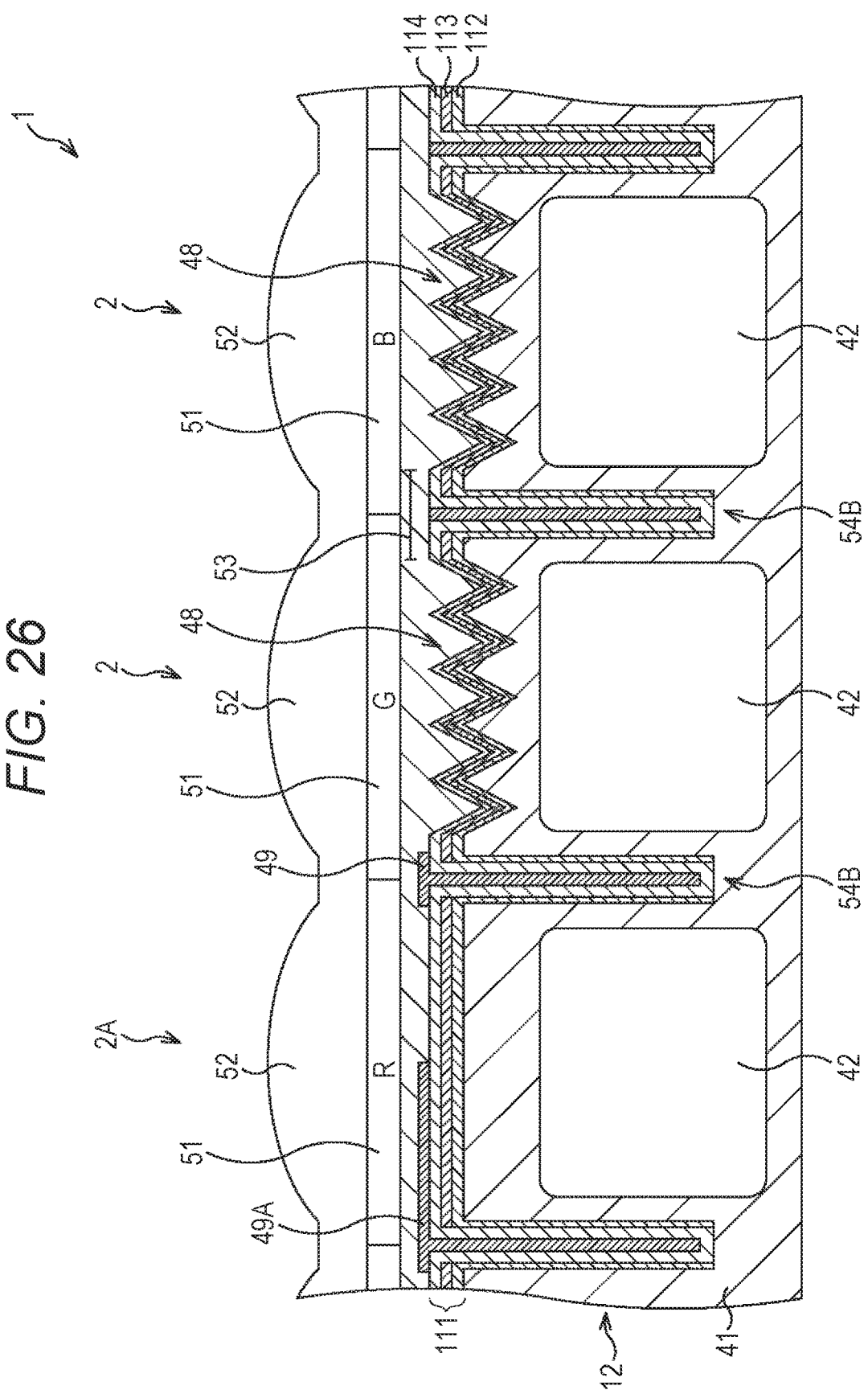
FIG. 26 is a diagram illustrating a sixteenth variation of the pixel structure.

FIG. 26 is a diagram illustrating a sixteenth variation of the pixel structure.

In FIG. 26, a basic structure of a solid-state imaging device 1 is common to the structure illustrated in FIG. 11. In addition, in the sixteenth variation of the pixel structure, an anti-reflection portion 48 is not provided in a phase difference pixel 2A used for the image plane phase difference AF, while a pixel separation portion 54B is formed.

Thus, also in the sixteenth variation of the pixel structure, pixels 2 being adjacent to each other can be electrically and optically separated from each other by the pixel separation portion 54B, and a flat portion 53 can be provided in the pixel structure between the pixels 2 other than the phase difference pixels 2A to suppress generation of diffracted light in the pixel separation region, thereby preventing color mixture from being generated.

<5. Exemplary Application to Electronic Apparatus>

The techniques according to the present disclosure are not limited to application to a solid-state imaging device. Accordingly, the techniques according to the present disclosure can be applied to any electronic apparatus using the solid-state imaging device for an image reading unit (photoelectric conversion unit), for example, an imaging device such as a digital still camera or a video camera, a portable terminal device with an imaging function, a copying machine using a solid-state imaging device for an image reading unit. The solid-state imaging device may be formed as one chip, or alternatively, may be of a module type with an imaging function, in which an imaging unit, and a signal processing unit or an optical system are collectively packaged.

Figure 27:
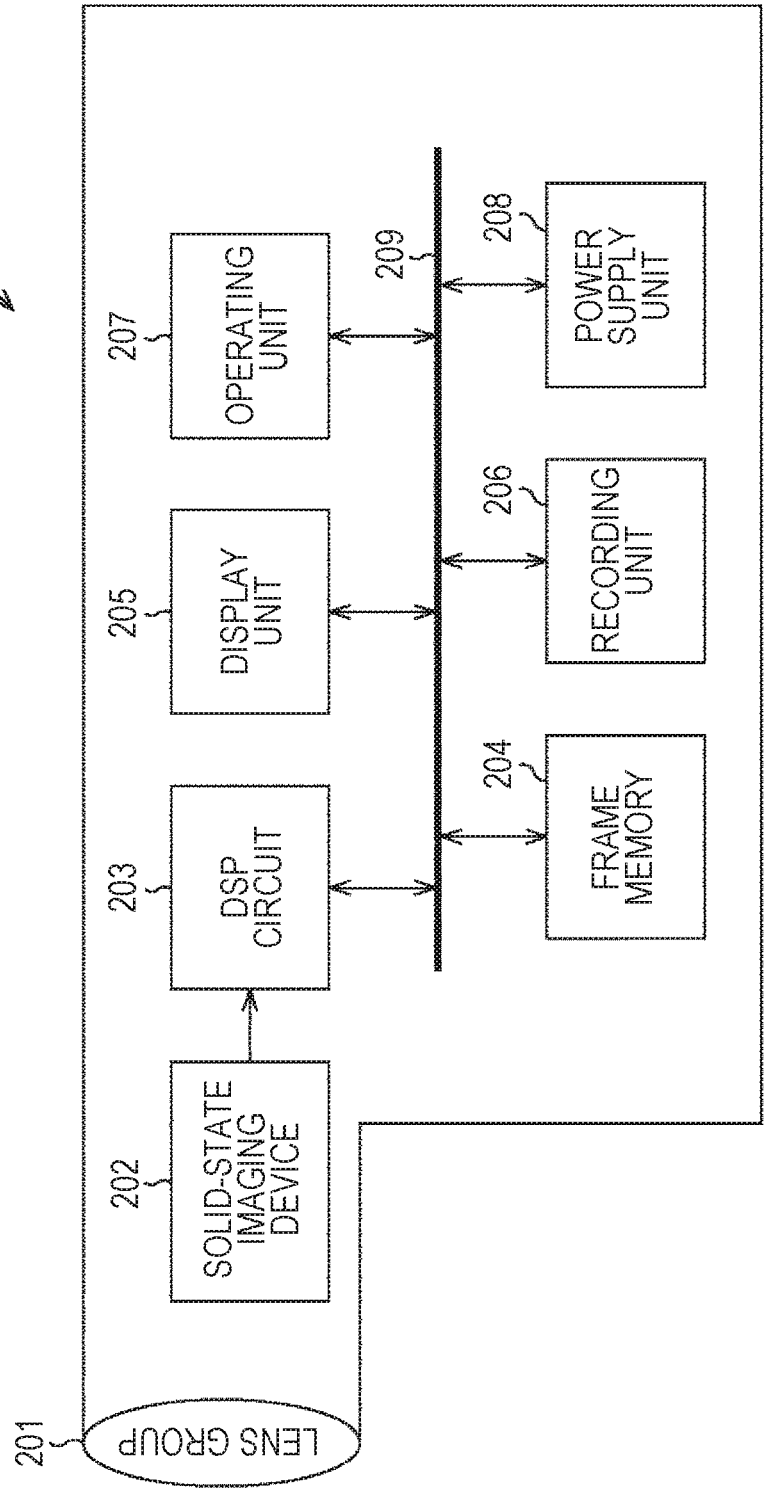
FIG. 27 is a block diagram illustrating an exemplary configuration of an imaging device serving as an electronic apparatus according to the present disclosure.

FIG. 27 is a block diagram illustrating an exemplary configuration of an imaging device serving as an electronic apparatus according to the present disclosure.

An imaging device 200 in FIG. 27 includes an optical unit 201 having a lens group, a solid-state imaging device (imaging device) 202 for which the configuration of the solid-state imaging device 1 in FIG. 1 is employed, and a digital signal processor (DSP) circuit 203 serving as a camera signal processing circuit. In addition, the imaging device 200 further includes a frame memory 204, a display unit 205, a recording unit 206, an operating unit 207, and a power supply unit 208. The DSP circuit 203, the frame memory 204, the display unit 205, the recording unit 206, the operating unit 207, and the power supply unit 208 are interconnected via a bus line 209.

The optical unit 201 captures incident light (image light) from a subject and forms an image on an imaging surface of the solid-state imaging device 202. The solid-state imaging device 202 converts an amount of incident light, of which an image is formed on the imaging surface by the optical unit 201, to an electric signal for each pixel to output as a pixel signal. The solid-state imaging device 1 in FIG. 1, namely, a solid-state imaging device capable of improving sensitivity while suppressing degradation of color mixture, can be used as the solid-state imaging device 202.

The display unit 205, including a panel-type display device such as a liquid crystal panel or an organic electro luminescence (EL) panel, displays a video or a still image captured by the solid-state imaging device 202. The recording unit 206 stores a video or a still image captured by the solid-state imaging device 202 in a storage medium such as a hard disk or a semiconductor memory.

The operating unit 207 issues operating instructions for various functions of the imaging device 200 in accordance with operation by a user. The power supply unit 208 properly supplies various types of power to the DSP circuit 203, the frame memory 204, the display unit 205, the recording unit 206, and the operating unit 207 as operation power for these units to be supplied.

As described above, the aforementioned solid-state imaging device 1 can be used as the solid-state imaging device 202 to improve sensitivity while suppressing degradation of color mixture. Accordingly, also in the imaging device 200 such as a video camera, a digital still camera, or even a camera module for a mobile device such as a portable telephone, quality of a captured image can be improved.

The embodiments according to the present disclosure are not limited to the aforementioned embodiments and various modifications can be made without departing from the scope of the present disclosure.

In the example described above, the solid-state imaging device whose signal charge is an electron has been described, assuming that the first conductivity type is the P-type and the second conductivity type is the N-type; however, the present disclosure can be applied to a solid-state imaging device whose signal charge is a hole. In other words, assuming that the first conductivity type is the N-type and the second conductivity type is the P-type, each of the aforementioned semiconductor regions can be constituted by a semiconductor region of an opposite conductivity type.

Furthermore, the techniques according to the present disclosure are not limited to application to a solid-state imaging device that detects a distribution of an amount of visible incident light to image as an image, and can be applied to a solid-state imaging device that images, as an image, a distribution of an incident amount of, for example, an infrared ray, an X-ray, or a particle, and any solid-state imaging device (physical quantity distribution detector) such as a fingerprint detection sensor that detects a distribution of other physical quantity in a broad sense, for example, pressure or static capacitance, to image as an image.

Note that the present disclosure can be also configured as described below.

(1)
A solid-state imaging device including an anti-reflection portion having a moth-eye structure provided on a boundary surface on a light-receiving surface side of a photoelectric conversion region of each pixel arranged two-dimensionally, and an inter-pixel light-blocking portion provided below the boundary surface of the anti-reflection portion to block incident light.

(2)
The solid-state imaging device described in (1) above, in which the photoelectric conversion region is a semiconductor region, and the inter-pixel light-blocking portion has a trench structure obtained by digging the semiconductor region in a depth direction at a pixel boundary.

(3)
The solid-state imaging device described in (2) above, in which the inter-pixel light-blocking portion is formed by filling the semiconductor region dug in the depth direction with a transparent insulation film.

(4)
The solid-state imaging device described in (2) or (3) above, in which the inter-pixel light-blocking portion is formed by filling the semiconductor region dug in the depth direction with a transparent insulation film and a metal material.

(5)
The solid-state imaging device described in (3) or (4) above, in which a pinning layer is laminated between the semiconductor region and the transparent insulation film.

(6)
The solid-state imaging device described in (3) or (4) above, in which a pinning layer and an anti-reflection film are laminated between the semiconductor region and the transparent insulation film.

(7)
The solid-state imaging device described in any one of (1) to (6) above, in which the anti-reflection portion is formed at a central area of the pixel in a region corresponding to a predetermined percentage of a pixel region.

(8)
The solid-state imaging device described in (7) above, in which the anti-reflection portion is formed at the central area of the pixel in a region corresponding to 80% of the pixel region.

(9)
The solid-state imaging device described in any one of (1) to (8) above, in which a groove width of the inter-pixel light-blocking portion is equal to or more than 40 nm.

(10)
The solid-state imaging device described in any one of (1) to (9) above, in which a digging amount in the depth direction of the inter-pixel light-blocking portion is equal to or longer than a wavelength of incident light.

(11)
The solid-state imaging device described in any one of (1) to (10) above, in which a flat portion is provided, between the pixels on the boundary surface on the light-receiving surface side, by a region of a predetermined width where the moth-eye structure serving as the anti-reflection portion is not formed.

(12)
The solid-state imaging device described in (11) above, in which a pixel separation portion that separates between the photoelectric conversion regions of the pixels being adjacent to each other is provided by filling, with an insulating material, the trench obtained by digging the semiconductor region in the depth direction in the flat portion.

(13)
The solid-state imaging device described in (12) above, in which the inside of the insulating material is filled with a light-blocking material with a light-blocking property in the trench of the pixel separation portion.

(14)
The solid-state imaging device described in any one of (1) to (13) above, further including a phase difference pixel that outputs a signal for controlling auto focus using a phase difference in an image plane, in which the boundary surface on the light-receiving surface side of the phase difference pixel is formed into a flat surface.

(15)

A method for manufacturing a solid-state imaging device, including forming an anti-reflection portion having a moth-eye structure on a boundary surface on a light-receiving surface side of a photoelectric conversion region of each pixel arranged two-dimensionally, and forming an inter-pixel light-blocking portion below the boundary surface of the anti-reflection portion to block incident light.

(16)

An electronic apparatus including a solid-state imaging device that includes an anti-reflection portion having a moth-eye structure provided on a boundary surface on a light-receiving surface side of a photoelectric conversion region of each pixel arranged two-dimensionally, and an inter-pixel light-blocking portion provided below the boundary surface of the anti-reflection portion to block incident light.

REFERENCE SIGNS LIST

1 Solid-state imaging device
2 Pixel
3 Pixel array section
12 Semiconductor substrate
41, 42 Semiconductor region
45 Pinning layer
46 Transparent insulation film
47 Inter-pixel light-blocking portion
48 Anti-reflection portion
49 Light-blocking film
50 Planarization film
51 Color filter layer
52 On-chip lens
101 Metal light-blocking portion
200 Imaging device
202 Solid-state imaging device

The invention claimed is:

1. A solid-state imaging device, comprising:
  a semiconductor substrate;
  a first photoelectric conversion region located in the semiconductor substrate;
  a second photoelectric conversion region located in the semiconductor substrate, the second photoelectric conversion region being adjacent to the first photoelectric conversion region;
  a trench including at least one different material than the semiconductor substrate and disposed between the first photoelectric conversion region and the second photoelectric conversion region;
  a first uneven structure on a light receiving side of the semiconductor substrate and disposed over the first photoelectric conversion region;
  a second uneven structure on the light receiving side of the semiconductor substrate and disposed over the second photoelectric conversion region;
  a first flat portion disposed at the semiconductor substrate, the first flat portion being between the trench and the first uneven structure; and
  a second flat portion disposed at the semiconductor substrate, the second flat portion being between the trench and the second uneven structure.

2. The solid-state imaging device according to claim 1, wherein the first and the second uneven structures each have a concave portion on the light receiving side of the semiconductor substrate in a cross-sectional view.

3. The solid-state imaging device according to claim 1, wherein the trench extends in a depth direction of the semiconductor substrate in a cross-sectional view, and
  the first flat portion and the second flat portion have a surface being parallel to a direction perpendicular to the depth direction.

4. The solid-state imaging device according to claim 1, further comprising:
  a first pixel including the first photoelectric conversion region, the first uneven structure and the first flat portion; and
  a second pixel including the second photoelectric conversion region, the second uneven structure and the second flat portion, wherein the second pixel is adjacent to the first pixel.

5. The solid-state imaging device according to claim 4, further comprising:
  a first color filter disposed over the first uneven structure; and
  a second color filter disposed over the second uneven structure.

6. The solid-state imaging device according to claim 5, wherein the first uneven structure is located at a central area of the first pixel in a region corresponding to approximately 80% of a width of the first color filter in a cross-sectional view.

7. The solid-state imaging device according to claim 5, wherein
  the first color filter corresponds to a first color,
  the second color filter corresponds to a second color, the second color being different from the first color, and
  a pitch of the first uneven structure under the first color filter and a pitch of the second uneven structure under the second color filter is the same.

8. The solid-state imaging device according to claim 5, wherein
  the first color filter corresponds to a first color,
  the second color filter corresponds to a second color, the second color being different from the first color,
  the first uneven structure has at least two recessed portions,
  the second uneven structure has at least two recessed portions, and
  a number of recessed portions in the first uneven structure under the first color filter and a number of recessed portions in the second uneven structure under the second color filter is the same.

9. The solid-state imaging device according to claim 5, wherein
  the first color filter corresponds to a first color,
  the second color filter corresponds to a second color, the second color being different from the first color,
  the first uneven structure has a recessed portion,
  the second uneven structure has a recessed portion, and
  a depth of the recessed portion in the first uneven structure under the first color filter and a depth of the recessed portion in the second uneven structure under the second color filter is the same.

10. The solid-state imaging device according to claim 1, wherein the first uneven structure includes at least two recessed portions based on the first flat portion, and
  the second uneven structure includes at least two recessed portions based on the second flat portion.

11. The solid-state imaging device according to claim 1, wherein the at least one different material comprises:
 a first insulation film disposed in the trench.

12. The solid-state imaging device according to claim 11, wherein a refraction index of the first insulation film is smaller than that of the semiconductor substrate.

13. The solid-state imaging device according to claim 11, wherein the first insulation film is an oxide.

14. The solid-state imaging device according to claim 11, wherein the first insulation film includes silicon.

15. The solid-state imaging device according to claim 11, wherein the first insulation film comprises a silicon oxide.

16. The solid-state imaging device according to claim 11, wherein the at least one different material comprises:
 a second insulation film disposed between the semiconductor substrate and the first insulation film.

17. The solid-state imaging device according to claim 16, wherein the second insulation film directly contacts along a sidewall of the trench in a cross-sectional view.

18. The solid-state imaging device according to claim 16, wherein the second insulation film is an oxide.

19. The solid-state imaging device according to claim 16, wherein the second insulation film has a negative fixed charge.

20. The solid-state imaging device according to claim 16, wherein the second insulation film comprises a hafnium oxide.

21. The solid-state imaging device according to claim 16, wherein the second insulation film is disposed on the first uneven structure and the second uneven structure, and the second insulation film is disposed along the first uneven structure and the second uneven structure in a cross-sectional view.

22. The solid-state imaging device according to claim 16, wherein the first insulation film is disposed more interior to the trench than the second insulation film in a cross-sectional view.

23. The solid-state imaging device according to claim 22, wherein the at least one different material comprises a third insulation film disposed between the first insulation film and the second insulation film in a cross-sectional view.

24. The solid-state imaging device according to claim 23, wherein the third insulation film is an oxide.

25. The solid-state imaging device according to claim 23, wherein the third insulation film comprises a tantalum oxide.

26. The solid-state imaging device according to claim 23, wherein the third insulation film is disposed on the first uneven structure and the second uneven structure, and the third insulation film is disposed along the first uneven structure and the second uneven structure in a cross-sectional view.

27. The solid-state imaging device according to claim 26, wherein the second insulation film is disposed between the first uneven structure and the third insulation film.

28. The solid-state imaging device according to claim 1, wherein a conductivity type of the first photoelectric conversion region and the second photoelectric conversion region is N-type.

29. The solid-state imaging device according to claim 1, wherein a conductivity type of a region located between the first photoelectric conversion region and the first uneven structure in the semiconductor substrate is P-type.

30. The solid-state imaging device according to claim 1, wherein the width of the trench in a direction parallel to the first flat portion is equal to or more than 40 nm.

31. The solid-state imaging device according to claim 1, further comprising:
 a light-blocking film disposed over the trench.

32. The solid-state imaging device according to claim 31, wherein the at least one different material comprises:
 a first insulation film disposed in the trench, the first insulation film disposed over the first uneven structure, the second uneven structure and the trench,
 wherein the light blocking film is disposed over the first insulation film.

33. The solid-state imaging device according to claim 31, wherein the light blocking film includes a metal.

34. The solid-state imaging device according to claim 31, wherein the light blocking film includes aluminum.

35. The solid-state imaging device according to claim 1, wherein a depth of the trench is larger than a width of the trench in a cross-sectional view.

36. The solid-state imaging device according to claim 1, wherein the first uneven structure has a recessed portion, the recessed portion having a first side surface and a second side surface in a cross-sectional view,
 the trench has a third side surface and a fourth side surface in a cross-sectional view, and
 an angle between the first side surface and the second side surface is different than an angle between the third side surface and the fourth side surface.

37. The solid-state imaging device according to claim 1, wherein the first uneven structure has a recessed portion, and
 a side surface of the recessed portion in a first side is unparallel to a side surface of the trench in the first side in a cross-sectional view.

38. A method of manufacturing a solid-state imaging device comprising:
 forming an uneven structure on a surface of a substrate, wherein the uneven structure is above a first photoelectric conversion region and a second photoelectric conversion region; and
 forming a trench between the first photoelectric conversion region and the second photoelectric conversion region in the substrate after forming the uneven structure, the trench including at least one different material than the substrate,
 wherein a flat portion remains between the uneven structure and the trench when the trench is formed.

39. The method of manufacturing a solid-state imaging device according to claim 38, wherein the uneven structure is formed by wet etching processing, and wherein the trench is formed by dry etching processing.

40. A method of manufacturing a solid-state imaging device comprising:
 forming a trench between a first photoelectric conversion region and a second photoelectric conversion region in a substrate, the trench including at least one different material than the substrate; and
 forming an uneven structure on a surface of the substrate, wherein the uneven structure is above the first photoelectric conversion region and the second photoelectric conversion region after forming the trench, and
 wherein a flat portion remains between the uneven structure and the trench when the trench is formed.

41. The method of manufacturing a solid-state imaging device according to claim 40, wherein the uneven structure is formed by wet etching processing, and wherein the trench is formed by dry etching processing.

* * * * *